United States Patent

Shindo et al.

[19]

[11] Patent Number: 5,845,660
[45] Date of Patent: Dec. 8, 1998

[54] SUBSTRATE WASHING AND DRYING APPARATUS, SUBSTRATE WASHING METHOD, AND SUBSTRATE WASHING APPARATUS

[75] Inventors: Naoki Shindo, Nirasaki; Yuuji Kamikawa, Kumamoto-ken; Shori Mokuo, Saga-ken; Yoshio Kumagai, Yamanashi-ken, all of Japan

[73] Assignee: Tokyo Electron Limited, Tokyo, Japan

[21] Appl. No.: 761,752

[22] Filed: Dec. 5, 1996

[30] Foreign Application Priority Data

| Dec. 7, 1995 | [JP] | Japan | 7-345278 |
| Jan. 12, 1996 | [JP] | Japan | 8-022073 |
| Feb. 7, 1996 | [JP] | Japan | 8-045380 |

[51] Int. Cl.$^6$ ........................ B08B 3/10
[52] U.S. Cl. ............... 134/56 R; 134/95.3; 134/102.3; 134/113; 134/186; 134/902
[58] Field of Search ................ 134/56 R, 57 R, 134/113, 902, 95.2, 95.3, 102.3, 58 R, 155, 186

[56] References Cited

U.S. PATENT DOCUMENTS 4,778,532  10/1988  McConnell et al. .

4,919,761  4/1990  Schiel et al. .

FOREIGN PATENT DOCUMENTS 0 385 536  9/1990  European Pat. Off. .
63-314835  12/1988  Japan ........................ 134/902

*Primary Examiner*—Frankie L. Stinson
*Attorney, Agent, or Firm*—Oblon, Spivak, McClelland, Maier & Neustadt, P.C.

[57] ABSTRACT

A substrate washing and drying apparatus comprising a processing section for holding wafers, to which process solution to wash and vapor for drying the wafers are introduced, a supply/discharge port for introducing solution to the process section, and discharging the solution from the process section, a solution supply mechanism for selecting one from a plurality of kinds of solution, a drying vapor generation section having a heater for generation vapor for drying, a discharging solution mechanism having an opening for rapidly discharging the solution from the processing section, resistivity detecting means for detecting a resistivity value of the process solution, and a controller for controlling the supply of solution to the process section based on the resistivity value detected by the resistivity detecting means.

20 Claims, 16 Drawing Sheets

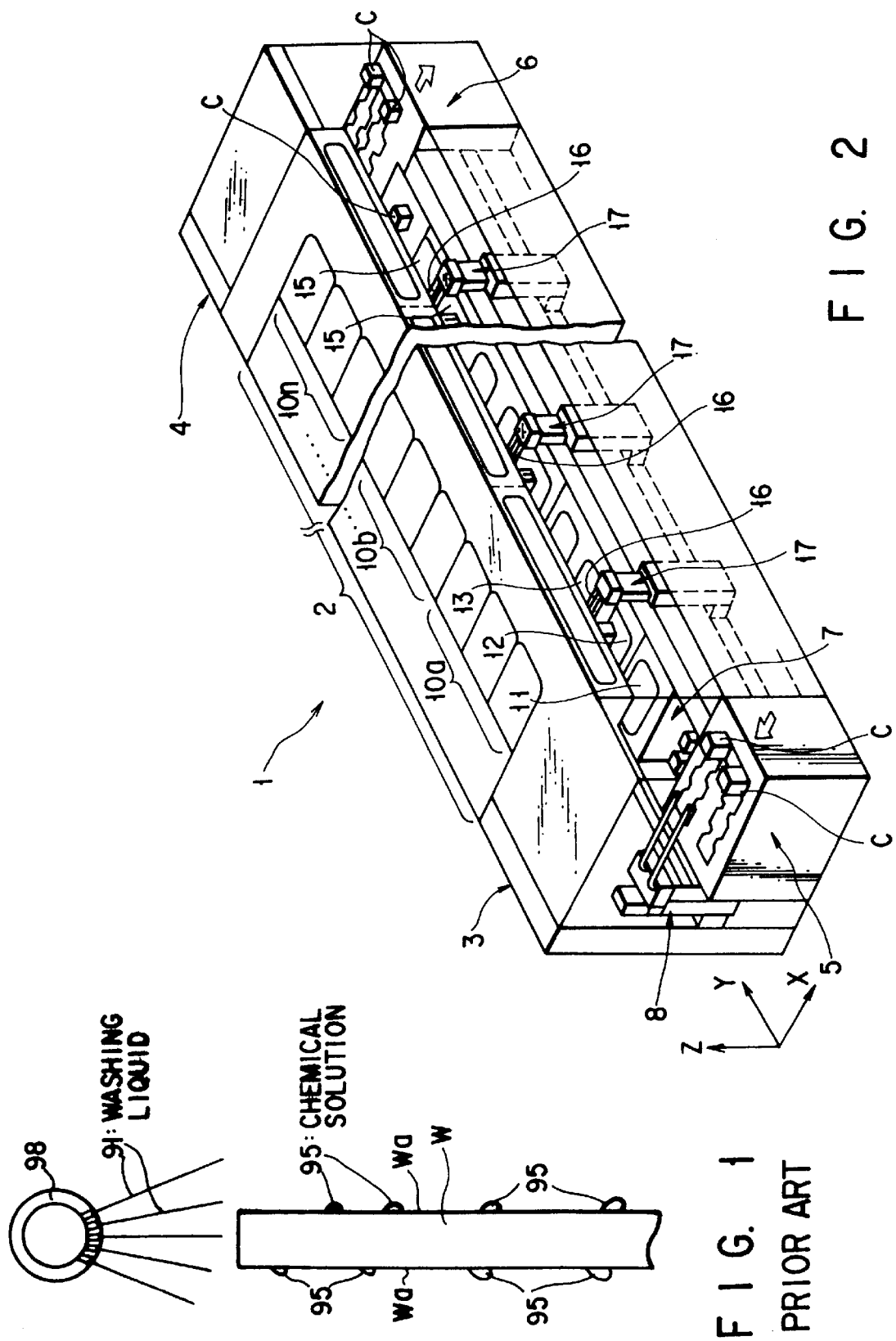

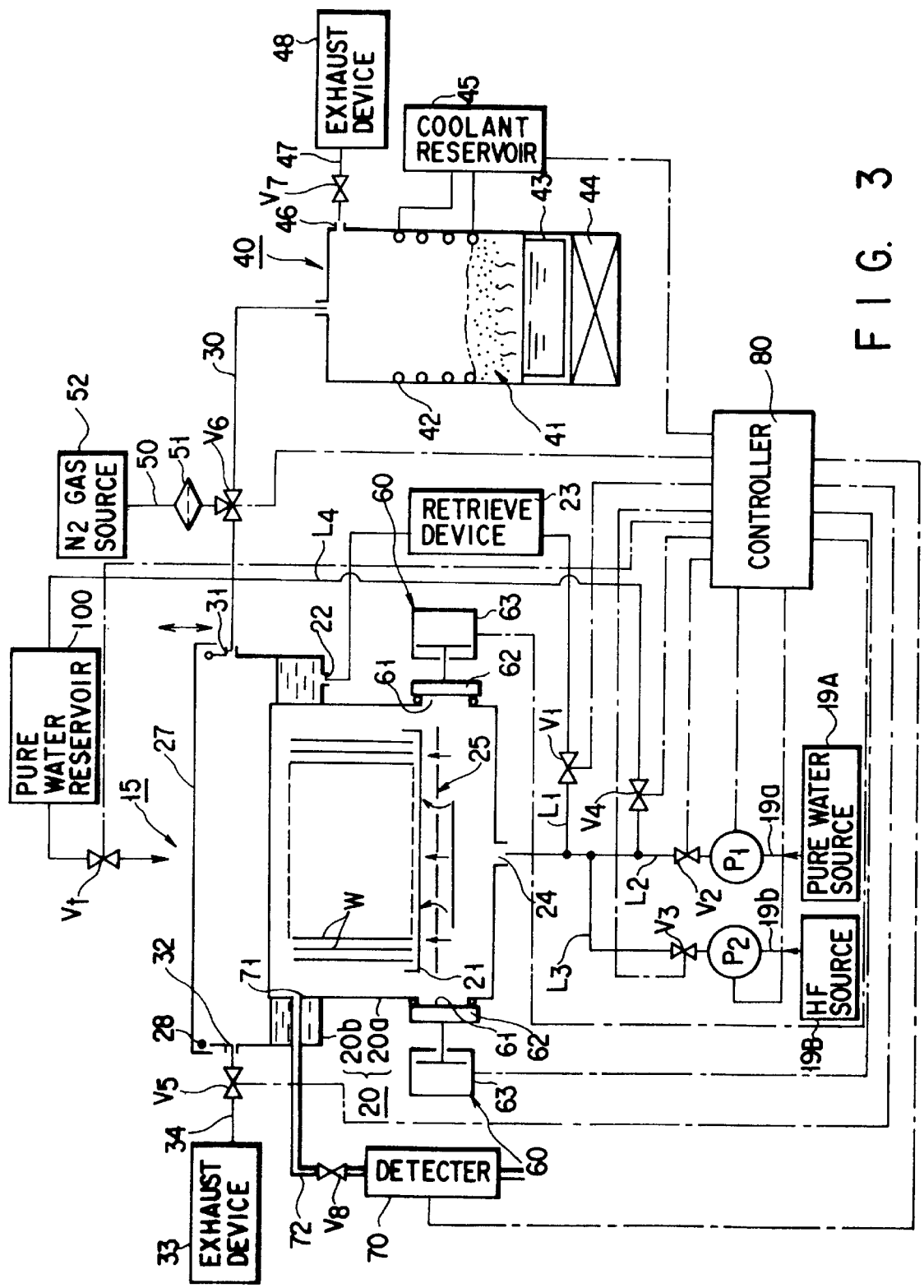
F I G. 3

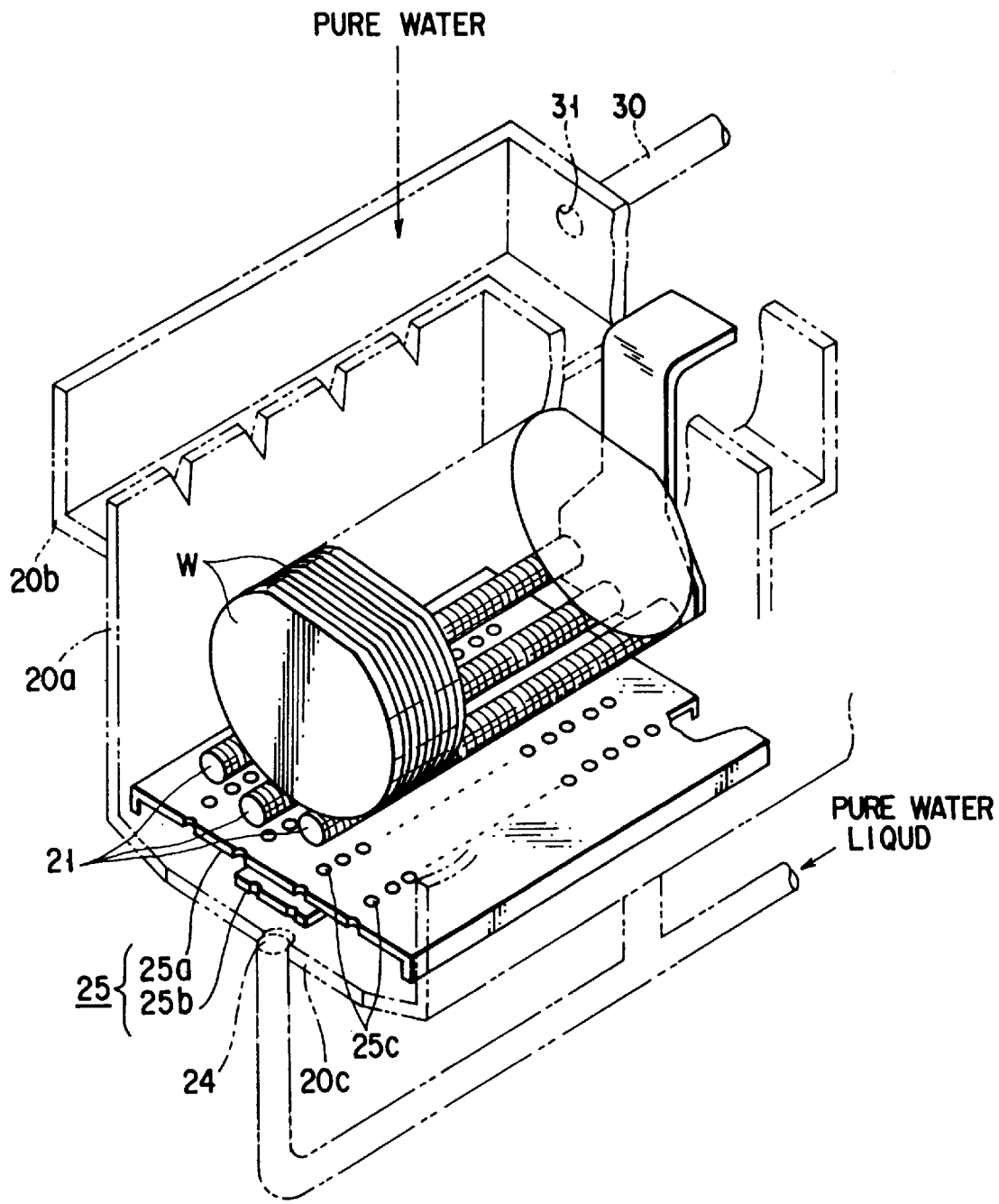
F I G. 4

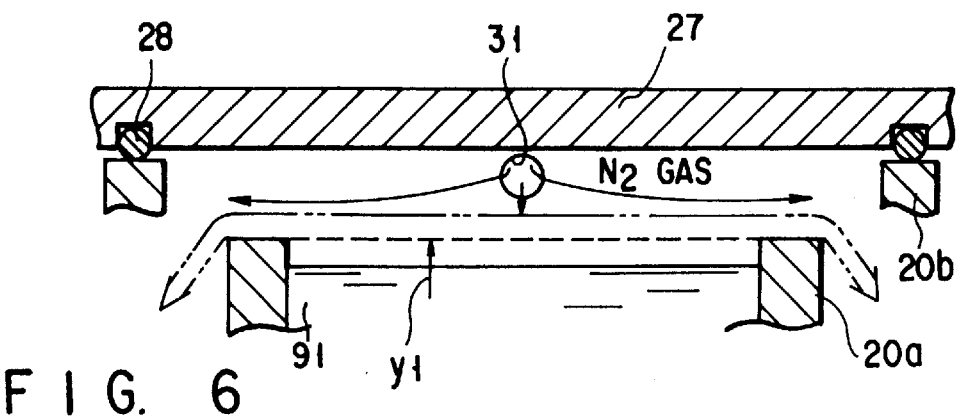
F I G. 6
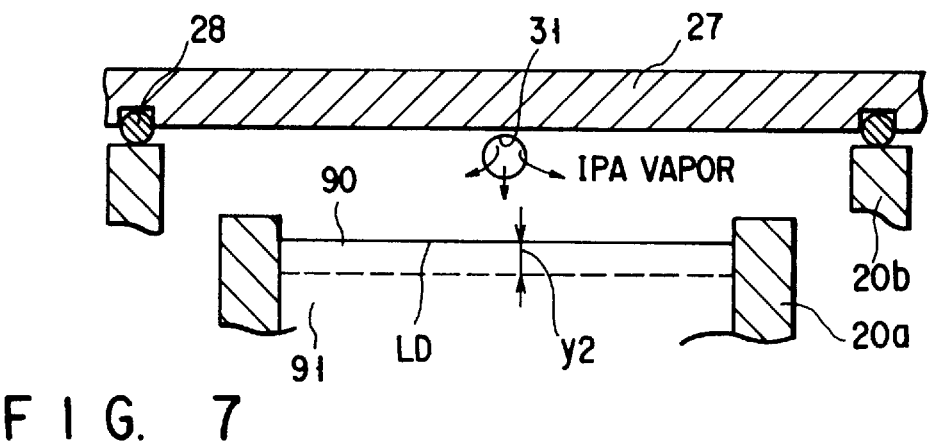
F I G. 7
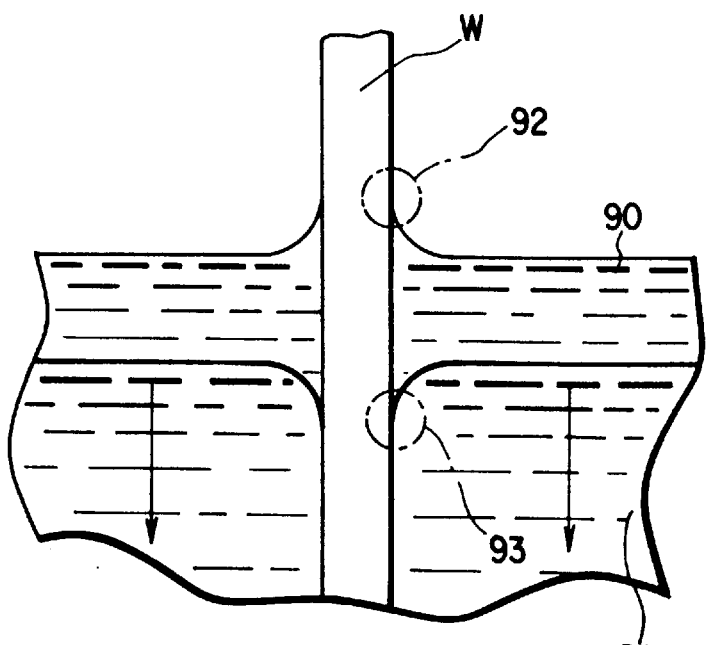
F I G. 8

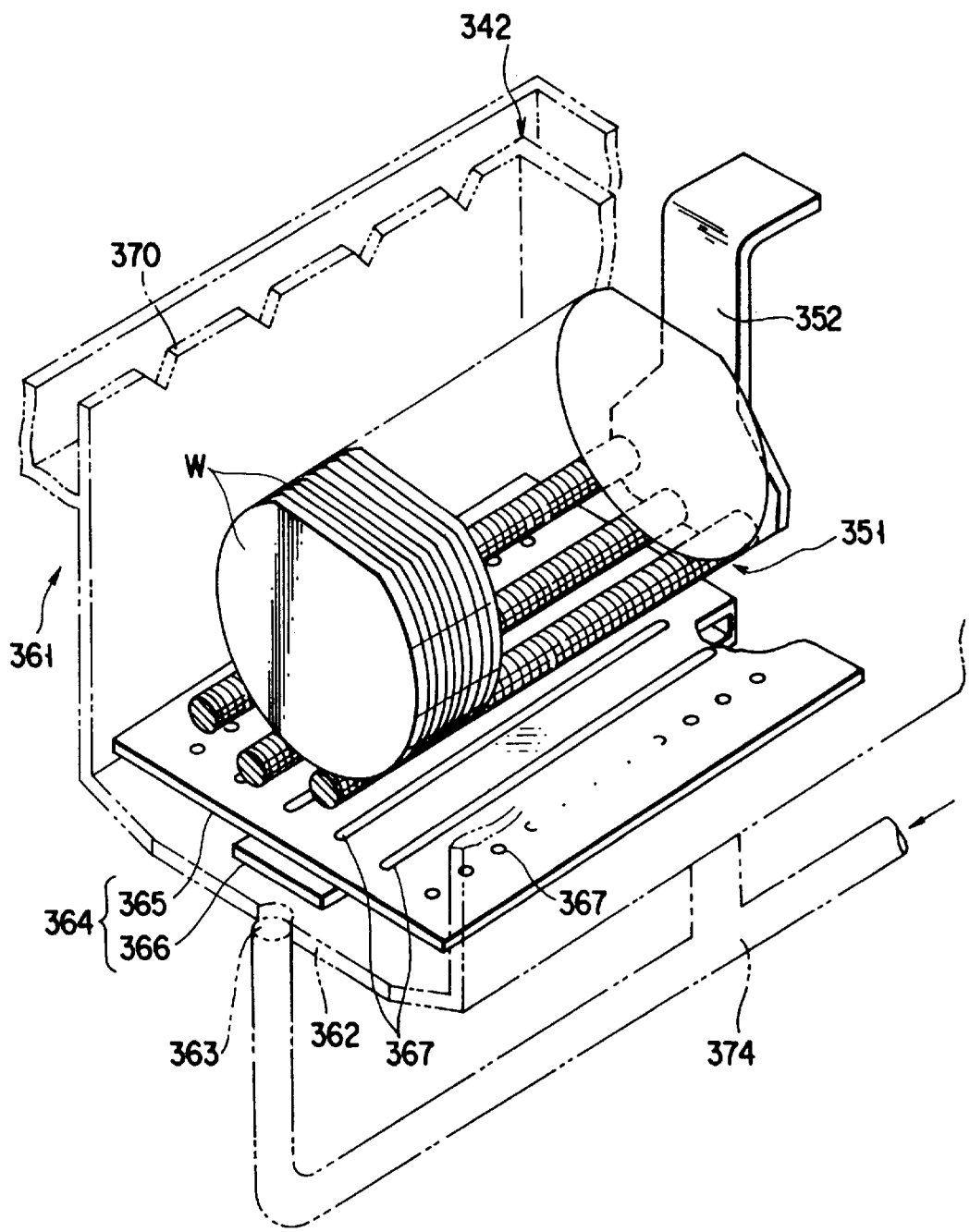
F I G. 18

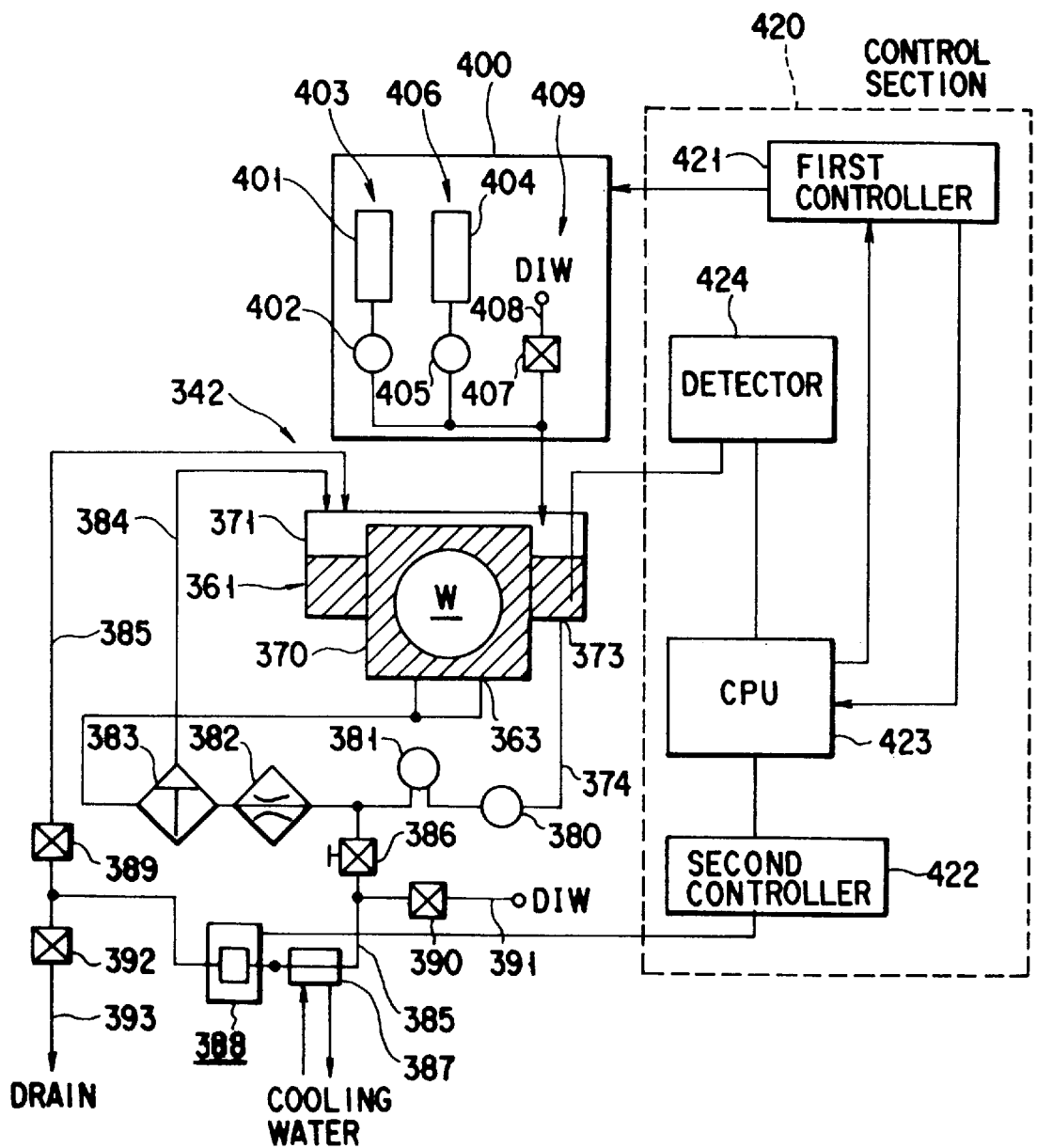
F I G. 21

SUBSTRATE WASHING AND DRYING APPARATUS, SUBSTRATE WASHING METHOD, AND SUBSTRATE WASHING APPARATUS

BACKGROUND OF THE INVENTION

FIELD OF THE INVENTION

The present invention relates to a substrate washing and drying apparatus for washing and drying a substrate such as a semiconductor wafer and an LCD glass substrate, a substrate washing method, and a substrate washing apparatus.

In the manufacturing process of the semiconductor device, there is used a washing apparatus for dipping a wafer in chemical solution or rinse liquid to be washed to remove natural oxide films, metallic impurity materials, or adhered particles from the surface of the wafer. Generally, the drying apparatus is added to the washing apparatus so that the washed wafer is continuously dried. In such a wet-type wafer washing and drying apparatus, the particles are easily adhered on the wet surface of the wafer while transferring the wafer from the washing unit to the drying unit.

Japanese Patent Application KOKAI Publication NO. 3-169013 (JPN. PAT. APPLN. KOKOKU Publication NO. 6-103686) discloses an apparatus, which washes the wafer with pure water and dries the wafer as substituting IPA (isopropyl alcohol) vapor for pure water. However, since this apparatus does not have a supply/discharge section for hydrogen fluoride solution (HF), a HF washing process and a water washing and drying process cannot be continuously performed. Due to this, the HF washing process is performed by use of a different apparatus.

As shown in FIG. 1, in conventional apparatus, washing solution (pure water) 91 is sprayed to the wafer from an upper nozzle 98. As a result, the collision force of the sprayed washing solution 91 against wafers W is lacking. As a result, HF solution droplets 95 are easily left on the main surface Wa of each wafer W. Then, the evenness of the washing process is lost by the residual HF droplets 95, and particles are adhered and acquired on the residual HF droplets 95. Moreover, the difference in the drying state is generated in the residual HF droplets 95 at the time of the drying process of the wafers W.

If a bare wafer or a wafer with a poly-Si film (wafer having hydrophobic surface) is washed with water after the HF washing process, SiOx, which is generated by the circulation of air or a silica component in pure water, is adhered or generated on the wafer surface. As a result, a defectiveness is caused in forming a circuit pattern.

In the conventional wafer washing process, various kinds of chemical processes such as an ammonia process, a hydrofluoric acid process, a sulphuric acid process, a hydrochloric acid process, etc. and the water washing process are alternatively performed. In each process vessel, the washing process using only one kind of chemical solution is performed. As a result, in the washing process using a large number of different chemical solution, the same number and more than of the chemical vessels as that of the water washing vessels must be provided. As a result, the size of the apparatus is enlarged.

To miniaturize the apparatus, there is proposed a so-called one-bath type apparatus in which chemical solution and pure water is alternatively replaced with each other in one process vessel to process the wafers W in one vessel by the plurality of kinds of chemical washing and water washing. However, in the one-bath type apparatus, there are three problems as follows.

First, it is difficult to completely remove chemical solution, which penetrates to the process vessel and a wafer boat, by the water washing process for a short period of time. Second, even if the water washing process is performed between a first chemical washing process and a second chemical washing process, the small amount of residual first chemical solution (alkali) is reacted with the second chemical solution (acid) to produce a reaction product (salts). As a result, there easily occurs a so-called "cross contamination" in which the wafer is contaminated with the reaction product. Third, due to the cross contamination, it is difficult to circulate the plurality of kinds of chemical solution in the process vessel through a common line.

If the circulation line of the respective chemical solution or a discharge line are separately provided to solve the third problem, the apparatus becomes complicated, and is enlarged. Moreover, the running cost increases, and the throughput decreases.

The conventional washing apparatus comprises an SC1 unit, an SC2 unit, and an HF unit.

The SC1 unit washes the wafer with the mixing solution of ammonia and hydrogen peroxide, the SC2 unit washes the wafer with mixing solution of hydrochloric acid and hydrogen peroxide, and the HF unit washes the wafer with hydrofluoric acid. Each unit comprises the chemical solution vessel and the water washing vessel, and the wafer processed with chemical solution is transferred to the water washing vessel. It is important that a predetermined amount of chemical solution be stably supplied to these chemical solution vessels at a predetermined concentration. However, since the concentration of the chemical solution having high volatility such as ammonia is gradually reduced, the washing process becomes uneven and unstable. Moreover, a considerable amount of chemical solution is adhered on the surface of the wafer and carried out to the outer portion of the process vessel. As a result, the amount of chemical solution contained in the process vessel is gradually reduced.

To solve the reduction of the chemical solution, in a case where the washing process is performed a predetermined number of times or processing time is passed, chemical solution, which has higher concentration than the normal case, is replenished to keep concentration of the chemical solution and the amount of the chemical solution in the process vessel to a predetermined level. In this case, the amount of chemical solution to be replenished and its concentration are empirically determined. Then, chemical solution having the empirically determined concentration is replenished by a predetermined amount every predetermined number of processes or the lapse of predetermined time. However, the method based on the empirical rule cannot sufficiently deal with a case in which the amount of consumption of the chemical solution is changed in accordance with the change of the number of the wafers or that the size. Or, the above-mentioned method cannot sufficiently deal with a case in which chemical solution having high volatility is used. As a result, concentration of a specific component contained in the chemical solution is gradually lacking or excessively increased. Moreover, in a case where the process is performed for a long period of time, there is possibility that the amount of the chemical solution of the process vessel will be lacking, so that the entire wafers are not evenly washed. Particularly, there is a case in which the wafer having a large diameter is not dipped in the chemical solution and the yield is lowered.

SUMMARY OF THE INVENTION

An object of the present invention is to provide a method for washing and drying a substrate and a small-sized substrate washing and drying apparatus with a high throughput, which can prevent particles from being adhered on a substrate, and which can control a difference in a drying state.

Also, an object of the present invention is to provide a method for washing and drying a substrate and a substrate washing and drying apparatus with a high throughput, which can efficiently carry out a discharge solution line at a factory side, and which can maintain chemical solution of a process vessel in a constant state.

According to the present invention, there is provided a substrate washing and drying apparatus comprising:

a processing section, having a capacity to accommodate a boat for holding a plurality of substrates, to which process solution to wash the substrates and vapor for drying the substrates are introduced;

a supply/discharge port, provided on a lower portion of the processing section, for introducing the process solution to the processing section, and discharging the process solution from the processing section;

a process solution supply mechanism for selecting at one kind of process solution from a plurality of kinds of process solution to be supplied to the processing section through the supply/discharge port;

a drying vapor generating section having heating means for generating vapor for drying;

a drying vapor supplying passage, communicating with each of the drying vapor generating section and the processing section, for supplying the generated drying vapor to the processing section;

a forcible discharging solution mechanism, provided at the lower portion of the processing section, having an opening for rapidly discharging the process solution from the processing section, and being capable of opening and closing;

resistivity detecting means for detecting a resistivity value of the process solution of the processing section; and controlling means for controlling the supply of the process solution to the processing section from the process solution supply mechanism based on the resistivity value detected by the resistivity detecting means.

According to the present invention, there is provided a substrate washing apparatus comprising:

a processing section having a capacity to accommodate a boat for holding a plurality of substrates;

a chemical solution supply line for supplying chemical solution for chemically washing the substrates to the processing section;

a pure water supply line for supplying pure water for washing the chemically washed substrates to the processing section;

a discharge line for discharging chemical solution and pure water from the process section;

a waste solution exhaust line for exhausting chemical solution and pure water from the processing section;

a valve provided in said discharge line;

a resistivity measuring device provided at a lower stream side than said valve; and a drain line communicating with said discharge line at the upper steam side than said valve.

According to the present invention, there is provided a substrate washing method comprising the steps of:

(a) overflowing process solution from a process vessel as process solution is supplied to the process vessel;

(b) dipping a plurality of substrates in the process solution of the process vessel at one time;

(c) detecting concentration and amount of the process solution of the process vessel;

(d) calculating the concentration and the amount of the process solution to be replenished in the process vessel by use of the detected concentration and amount of the process solution, and a predetermined equation; and (e) replenishing the calculated concentration and amount of process solution to the process vessel.

According to the present invention, there is provided a substrate washing apparatus comprising:

a process vessel having a boat for holding a plurality of substrates;

a process solution supply line for supplying process solution for washing the substrates to the process vessel;

a circulation line for returning process solution overflowed from the process vessel to the process vessel again;

a replenishing line for replenishing the process solution to the process vessel;

a concentration sensor for measuring concentration of the process solution flowing in the circulation line;

a liquid level sensor for measuring the amount of the process solution in the process vessel; and a controlling section for determining the concentration and the amount of the process solution to be replenished to the process vessel based on the concentration and the amount of the process solution measured by the concentration sensor and the liquid sensor so as to replenish the process solution to the process vessel through the replenishing line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a side view in which a wafer is enlarged to explain a conventional substrate washing method;

FIG. 2 is a perspective view of the outline of a conventional substrate washing and drying apparatus;

FIG. 3 is a block diagram showing the structure a substrate washing and drying apparatus according to the embodiment of the present invention;

FIG. 4 is an exploded perspective view showing the interior of a process vessel;

FIG. 6 is an enlarged cross-sectional view schematically showing the upper portion of the process vessel;

FIG. 7 is an enlarged cross-sectional view schematically showing the upper portion of the process vessel;

FIG. 8 is an enlarged view schematically showing the wafer and process solution seeing from the side;

FIG. 18 is an exploded perspective view showing the interior of the process vessel;

FIG. 21 is a block diagram showing a process solution circulation circuit.

DETAILED DESCRIPTION OF THE PREFERRED EMBODIMENTS

Figure 5:
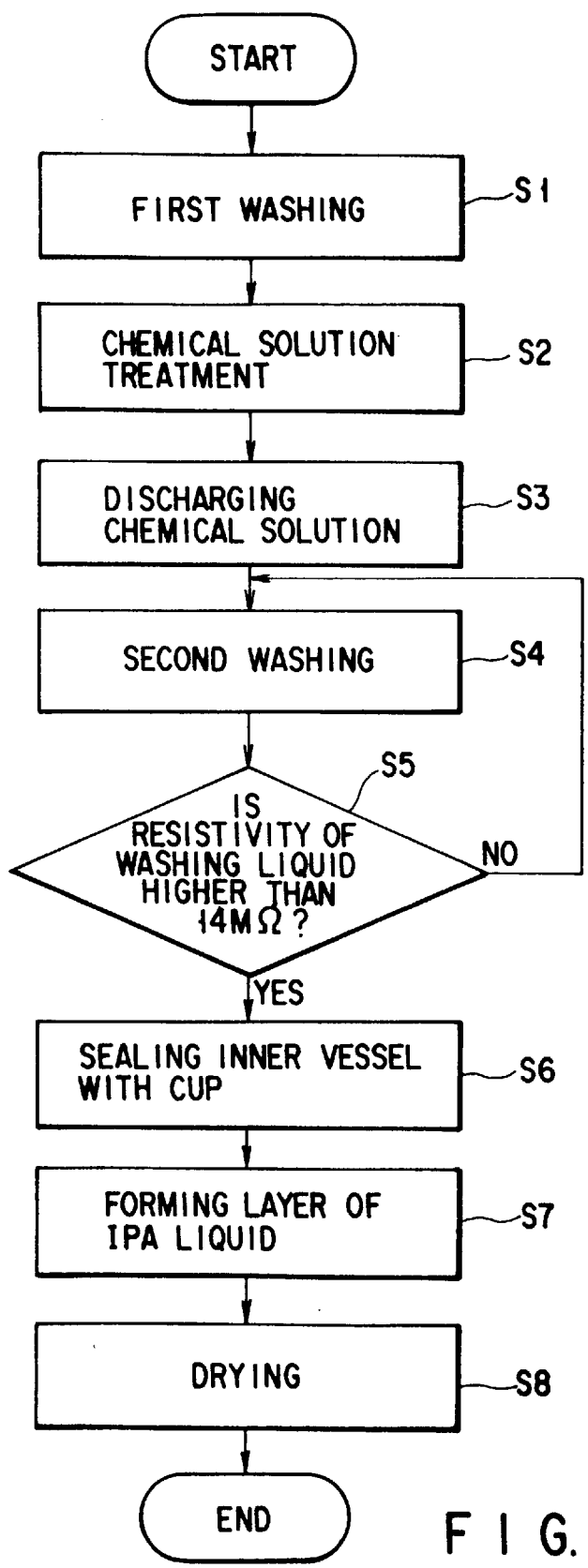
FIG. 5 is a flow chart showing a substrate washing and drying method according to the embodiment of the present invention.

The embodiments of the present invention will now be described with reference to the accompanying drawings.

The following will explain an apparatus for washing a semiconductor wafer and a washing method with reference to FIGS. 2 to 10.

A washing process system 1 comprises a process section 2, a loader section 3, and an unloader section 4. The loader section 3 is provided at one side end portion of the process section 2, and the unloader section 4 is provided at the other side end portion of the process section 2.

The loader section 3 comprises a mount section 5, an interface section 7, and a transfer device 8. On the mount section 5, a plurality of cassettes C is mounted. In each cassette C, 25 unprocessed wafers W are contained. The transfer device 8 pulls up the wafers W from the cassette C at one time to be positioned and transferred to the interface section 7. The interface section 7 is placed to be adjacent to the process section 2. The interface section is an interface area for delivering the wafers W from the transferring device 8 to a transfer mechanism 17.

The process section 2 comprises a plurality of washing units 10a, 10b, . . . 10n arranged in series in a Y-axial direction. Each unit has a chemical solution vessel 11, a first water washing vessel 12, and a second water washing vessel 13. In the chemical solution vessel 11, chemical solution such as ammonia hydrogen peroxide, hydrofluoric acid is supplied. Pure water is supplied to the first and second water washing vessels 12 and 13. After the wafers W, which are washed with water in the first and second water washing vessels 12 and 13, the wafers W are further processed by the units 10b to 10n provided at the downstream side.

A washing and drying unit 10n is provided at the most-down stream side of the process section 2. In the unit 10n, the wafers W are finally washed and an IPA drying process can be performed.

Three transfer mechanisms 17 are provided along the process section 2 to be rotatable in the Y-axial direction. Each transfer mechanism 17 has a wafer chuck 16 for chucking 50 wafers at one time. The wafer chuck 16 is movable to X- and Z-axes, and rotatable around the Z-axis at θ.

The unloader section 4 has a cassette mount potion 6. On the cassette mount portion 6, a plurality of cassettes C is mounted. In each cassette, wafers W, which are subjected to the washing and drying process by the units 10b to 10n, are contained.

The following will explain the wafer washing and drying apparatus of the washing and drying unit 10n with reference to FIGS. 3 and 4.

A wafer washing and drying apparatus 15 comprises a process vessel 20 and an IPA vapor generating generator 40. A solution supply/discharge port 24, which communicates with two solution supply sources 19A and 19B, is formed on the bottom of the process vessel 20. The first solution supply source 19A contains pure water, and supplies pure water to the process vessel 20 through a line $L_2$. The second solution supply source 19B contains hydrofluoric acid solution, and supplies HF solution to the process vessel 20 through a line $L_3$.

The IPA vapor generating generator 40 communicates with the upper side portion of the vessel 20 through a line 30. The IPA vapor generating generator 40 comprises a vapor generating section 41 and a cooling section 42. An IPA solution reserving section 43 is provided at the bottom of the vapor generating section 41. Moreover, a heater 44 is provided at the lower portion of the IPA solution reserving section 43 to heat IPA solution, so that IPA vapor is generated. The cooling section 42 is provided along the inner wall of the upper portion of the vapor generating section 41 in a zigzag. Then, coolant is supplied to the zigzag cooling section 42 from a coolant reservoir 45. As a result, IPA vapor of the vapor generating section 41 is condensed and liquefied.

A discharge port 46 is formed on the upper side wall of the vapor generating section 41. A discharge line 47 communicates with the discharge port 46 through a valve $V_7$. The discharge line 47 communicates with an exhaust device 48.

The line 30 communicates with a line 50 through a three way change-over valve $V_6$. The line 50 communicates with an $N_2$ gas supply source 52 through a filter 51. If the three way change-over valve $V_6$ is changed, $N_2$ gas for IPA vapor is supplied to the process vessel 20. Regarding the operations of valves $V_1$ to $V_7$, Vt, pump $P_1$, $P_2$, the coolant reservoir 45, and a forcible discharge mechanism 60, they are controlled by control means 80, respectively.

The process vessel 20 comprises an inner vessel 20a and an outer vessel 20b. Solution overflowed from the inner vessel 20a flows into the outer vessel 20b. A discharge port 22 is formed on the outer vessel 20b. The discharge port 22 communicates with a retrieve device 23 through an overflow line. The upper opening of the process vessel 20 is covered with a cup 27. The cup 27 comprises an O-ring 28 contacting the upper surface of the outer vessel 20b. The cup 27 is supported by a lift mechanism (not shown) to be approached the outer vessel 20b or separated from the outer vessel 20b.

A supply/discharge port 24 is formed on the bottom portion 20c of the inner vessel 20a. The discharge line $L_1$ communicates with the supply/discharge port 24, and the process solution is discharged from the inner vessel 20a through the discharge line $L_1$ communicates with the retrieve device 23 through the valve $V_1$. The solution supply lines $L_2$ and $L_3$ of two systems communicate with the supply/discharge port 24. The line $L_2$ communicates with the pure water supply source 19A through the pump $P_1$ and the valve $V_2$. The line $L_3$ communicates with the HF supply source 19B through the pump $P_2$ and the valve $V_3$.

As shown in FIG. 4, a wafer boat 21 is provided in the inner vessel 20a. The wafer boat 21 is supported by the lift mechanism (not shown) through an arm. Three holding rods are horizontally attached to the lower end portion of the arm. Each rod has 50 grooves with an equal pitch, and the wafers W are held in the grooves, respectively. The wafer boat 21 is made of high strength resin material having good corrosion resistance and heat resistance such as polyether ether ketone (PEEK) or quartz.

There is formed rectifying means 25 between the bottom 20c of the inner vessel and the boat 21. The rectifying means 25 comprises a porous plate 25a and a diffusion plate 25b. The large number of small holes 25c are formed on the porous plate 25a. The diffusion plate 25b is positioned just over the supply/discharge port 24. In place of the rectify means, the nozzle may be used to supply the pros solution to the process sefiour.

As shown in FIG. 3, a plurality of forcible discharge mechanisms 60 is provided on the lower portion of the inner vessel 20a.

Each mechanism 60 comprises a discharge solution port 61, a cover 62, and a cylinder 63. The discharge solution port 61 is formed on the side wall of the lower portion. The diameter of the discharge solution port 61 is a couple of times to several tens of times as large as the supply/discharge port 24. The discharge solution port 61 having such a large diameter communicates with a tank (not shown). The cover 62 is coupled to the rod of the cylinder 63 to open and close the discharge solution port 61. In this case, a pneumatic or hydraulic cylinder may be used as the cylinder 63. Also, as an open/close mechanism of the cover 62, a link mechanism or a solenoid mechanism may be used in place of the cylinder.

A pure water reservoir 100 for a second washing is provided at the upper portion of the process vessel 20. The pure wafer reservoir 100 communicates with a line $L_4$ branched from the line $L_2$. Valves $V_4$ and $V_t$ are provided on the branch line L4. Pure water is supplied to be temporarily reserved in the pure water reservoir 100 from the pump $P_1$ through the valve $V_4$. Moreover, a predetermined amount of pure water is supplied to the wafers W of the inner vessel 20a from the pure water reservoir 100. In this case, a different supply source may be connected to the pure water reservoir 100 to supply pure water. Also, pure water may be introduced to the inner vessel 20a from the supply/discharge port 24.

An IPA vapor supply port 31, which communicates with the line 30, is formed on the upper side wall of one side of the outer vessel 20b, and an IPA vapor discharge port 32 is formed on the upper side wall of the other side of the outer vessel 20b. The IPA vapor discharge port 32 communicates with a discharge device 33 through a discharge line 34 and a valve $V_5$. A heater (not shown) is provided on the outer periphery of the line 30 to maintain IPA at the temperature of the boiling point (about 80° C.) or more.

The outer vessel 20b has the supply port 31 and the discharge port 32. The non-oxidizing gas line 50 communicates with the supply port 31 through the line 30, and the discharge line 34 communicates with the discharge port 32. $N_2$ gas is supplied to the process vessel 20 through the non-oxidizing gas line 50, and is discharged from the process vessel 20 through the discharge line 34.

A passing port 71 is formed at the upper portion of the inner vessel 20a. A resistivity detecting device 70 communicates with the port 71 through a detection tube 72 with a valve $V_8$, so that the resistivity value of pure water for second washing is detected. A detection signal from the device 70 is sent to the control means 80. As a result of the detection, if the resistivity value of the solution of the inner vessel 20a reaches 14 MΩ, an instruction input is output to the respective portions from the control means 80. As a result, the second washing is ended, and the process goes to a next drying process.

The following will explain a case in the wafers W are washed and dried by the above-explained apparatus with reference to FIGS. 5 to 8.

Fifty wafers W (one lot) are transferred to the process vessel 11 of the unit 10a. The chemical solution is introduced to the process vessel 11 to dip the wafers W therein. Thus, the wafers W are subjected to the washing process. In the case of the washing process to remove the organic matter and the particles, the mixing solution of ammonia and hydrogen peroxide is used as chemical solution. After this washing process, the wafers W are transferred to the first water washing vessel 12, so that the wafers W are washed with pure water. The wafers W are further transferred to the second water washing vessel 13, so that the wafers W are washed with pure water.

After the wafers are subjected to the necessary washing by the other units 10b to 10m, the wafers W are transferred to the final unit 10n. As a result, the wafers W are mounted on the boat 21 of the inner vessel 20a at one time. In transferring the wafers W to the inner vessel 20a, pure wafer 91 is supplied to the inner vessel 20a from the pure water supply source 19A, and pure wafer 91 is overflowed into the outer vessel 20b from the inner vessel 20a. In this case, the particles flows to the retrieve device 23 from the process vessel 20.

Thereafter, the washing and drying process is subjected to the wafers W in accordance with the steps of the flow charts shown in FIG. 5.

Specifically, control means 80 controls the operation of the pump $P_1$ and that of the valve $V_2$ in accordance with a predetermined program. As a result, a predetermined amount of pure water 91 is supplied to the inner vessel 20a for only a predetermined period of time. Or, pure water 91 is supplied to the inner vessel 20a until the resistivity value of the solution of the inner vessel 20a reaches a predetermined value. In this first water washing process, the amount of the supply of pure water 91 may be increased or decreased stepwise. For example, if the resistivity value of the solution exceeds 7 MΩ, the pump $P_1$ is stopped, the value $V_2$ is closed, and the first water washing process is ended (step S1).

Next, control means 80 controls the operation of the pump $P_2$ and that of the valve $V_3$. As a result, a predetermined amount of HF solution is supplied to the inner vessel 20a for only a predetermined period of time to remove the natural oxide film and the metallic impurity material from the surface of each wafer W. In this chemical solution washing process, the amount of the supply of HF solution may be increased or decreased stepwise. After passing a predetermined period of time, the pump $P_2$ is stopped, the valve $V_3$ is closed, and the chemical washing process is ended (step S2).

Next, the covers 62 of the respective mechanisms 60 are separated from the respective discharge ports 61. Then, these discharge ports 61 are opened simultaneously so as to rapidly exhaust HF solution from the inner vessel 20a (step S3).

If the inner vessel 20 becomes empty, the discharge port is closed by the cover 62. Then, control means 80 controls the operation of each of the pump $P_j$, and the valves $V_2$, $V_4$ in accordance with a predetermined program. As a result, pure water is temporarily reserved in the tank (pure water reservoir) 100. Next, the valve Vt is opened so as to supply pure water 91 from the tank 100 to the inner vessel 20a. Then, the wafers W are subjected to the second water washing process as overflowing pure water 91 from the inner vessel 20a (step S4). In this case, pure water may be supplied to be overflowed so that HF solution is substituted with pours water without being quickly discharged from the process section.

In the second water washing, the detector 70 detects whether or not the resistivity value of the solution (pure water mixing with a small amount of HF solution) of the inner vessel 20a is 14Ω or more (step S5). If the detected value is below 14Ω, the second water washing process of step S4 is continued.

If the detected value is 14Ω or more, the second water washing process is ended, a step S6 is executed. In the step S6, the cup 27 is moved to the outer vessel 20b. Then, the O-ring 28 and the upper surface of the outer vessel 20b are adhered closely to each other, so that the interior of the inner vessel 20a is set to an airtight state. (step S6).

The operations of the pump $P_1$ and the valve $V_2$ are controlled while $N_2$ gas is supplied to the interior of the airtight inner vessel 20a. As a result, pure water 91 is supplied to the inner vessel 20a through the supply/discharge port 24. As shown in FIG. 6, the liquid surface level of pure water 91 is moved up in a direction y1, and pure water 91 is overflowed from the upper end portion of the inner vessel 20a. As a result, the particles included in $N_2$ gas are discharged from the inner vessel 20a together with overflowing solution. The particles floating on the water surface of pure water 91 is also discharged. After passing a predetermined period of time, the valve $V_2$, is closed, and the supply of pure water 91 to the inner vessel 20a is stopped.

In the IPA vapor generating generator 40, the IPA vapor is generated, and the IPA vapor is cooled, condensed, and liquefied, so that the supply to the line 30 is not performed. At this time, the valve $V_7$ is closed.

The valve $V_5$ is opened, and the discharge device 33 is driven, to stop the supply of $N_2$ gas to the inner vessel 20a, and the operation of the coolant reservoir 45. As a result, the interior of the inner vessel 20a is set to be a predetermined pressure, and filled with IPA vapor. The IPA vapor is liquefied on the wafer surface of pure water 91 of the inner vessel 20a. As shown in FIG. 7, an IPA liquid layer 90 is formed up to a depth (thickness) $y_2$ from a liquid surface LD (step S7). In this case, the thickness and concentration of the IPA liquid layer 90 are determined by conditions such as a flow rate of the IPA vapor, the flowing time, inner pressure of the inner vessel 20a, etc. based on data obtained in advance.

Thereafter, the valve V5 is closed, the discharge device 33 is stopped, pure water 91 is discharged from the inner vessel 20a as the IPA vapor is supplied. As a result, the liquid surface level of pure water 91 of the inner vessel 20a is reduced, the wafers W appear on the water surface. Then, the wafers W contacts the IPA vapor, so that the wafers W are dried (step S8). After the end of the dry process, the supply of IPA vapor is stopped, so that the interior of the inner vessel 20a is discharged and $N_2$ gas is supplied thereto. If the inner vessel 20a is purged with $N_2$ gas, the cup 27 is opened, and the dried wafers W are transferred from the inner vessel 20a. Then, the processed wafers W are transferred to the unloader section 4 to be contained in the cassettes C on the cassette mount portion 6.

The following will explain the drying mechanism of the wafer W at the time of exhausting pure water with reference to FIG. 8.

If pure water 91 is discharged at a predetermined flow rate in a direction of an arrow of the figure through the supply/discharge port 24, the boundary surface of the IPA liquid layer 90 is changed to be a convex type 92 at the wafer W. Then, the boundary surface between the IPA liquid layer 90 and pure water 91 is changed to be a convex type 93 at the water W. The convex type 93 is generated by depending on wetness of IPA regardless of the surface state of the wafer W. As a result, the surface of the wafer W becomes to not remain the water droplets.

Figure 9:
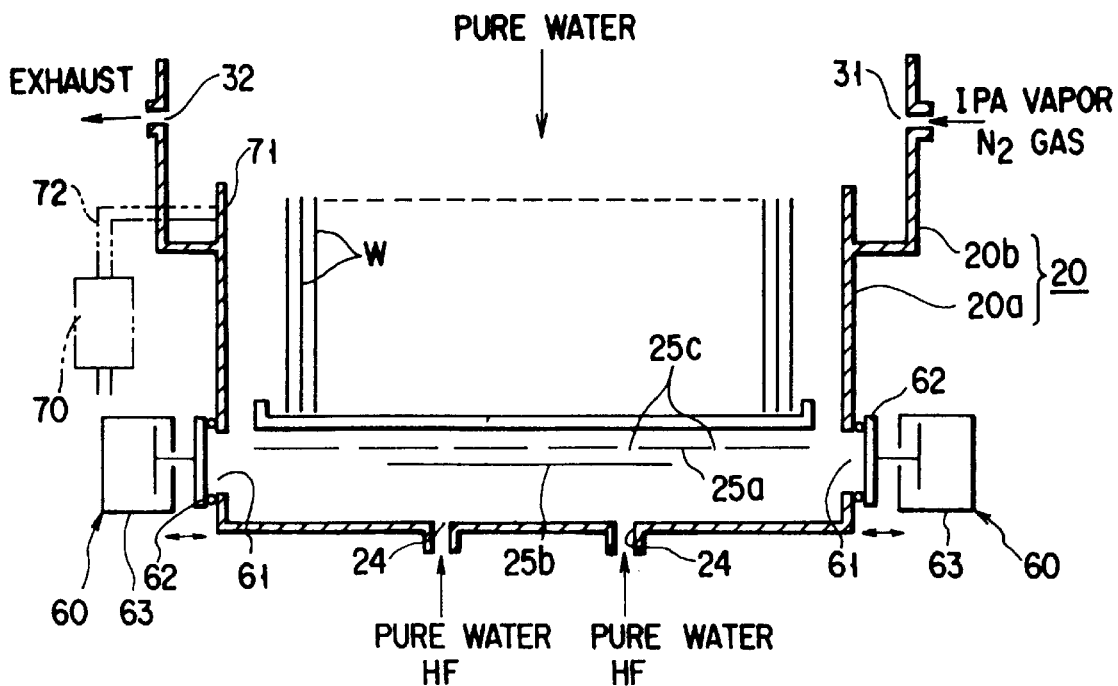
FIG. 9 is a cross-sectional view schematically showing a process vessel having a discharge mechanism.

Next, the following will explain the other embodiment of the present invention with reference to FIG. 9.

In the apparatus of this embodiment, two supply/discharge ports 24 are formed on the bottom of the inner vessel 20a. A large amount of pure water 91 can be supplied to the inner vessel 20a through these supply/discharge ports 24, and discharged from the inner vessel 20a. Also, a large amount of HF solution 91 can be supplied to the inner vessel 20a.

According to the above-mentioned apparatus, time for the first water washing process and time for the chemical washing process can be largely reduced. In an apparatus for washing and drying a wafer having a large diameter or a glass substrate for LDC, three or more supply/discharge ports 24 are preferably formed on the bottom of the inner vessel 20a.

Figure 10:
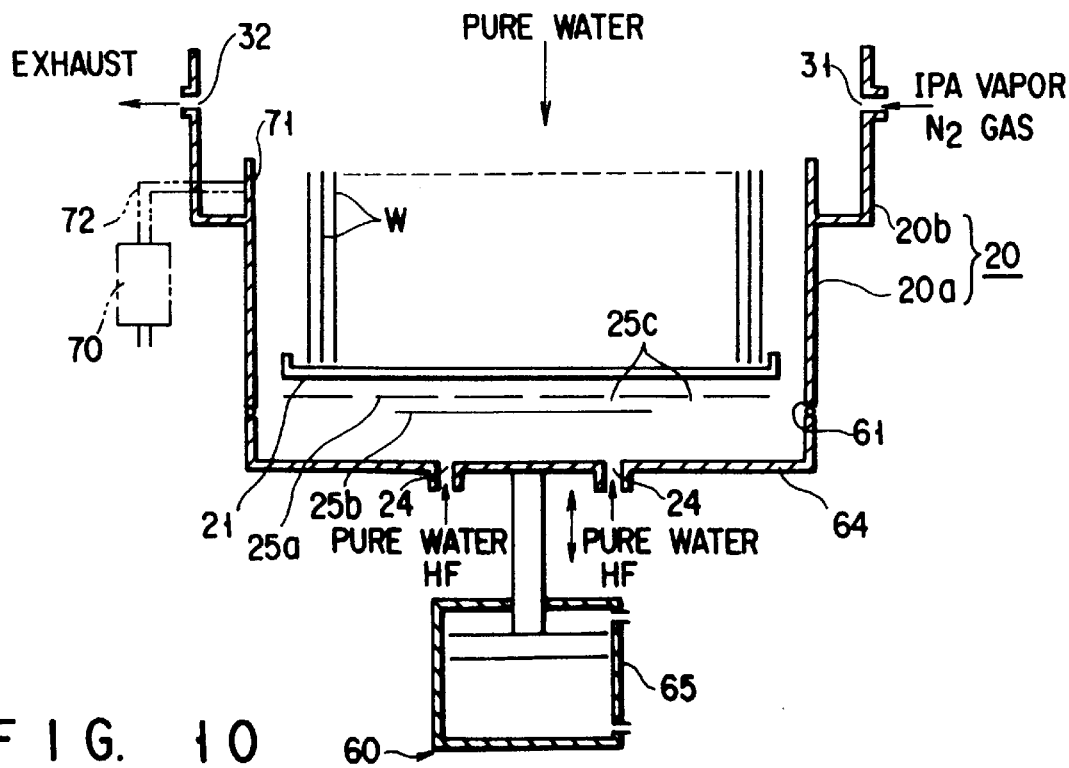
FIG. 10 is a cross-sectional view schematically showing a process vessel having the other discharge mechanism.
Figure 11:
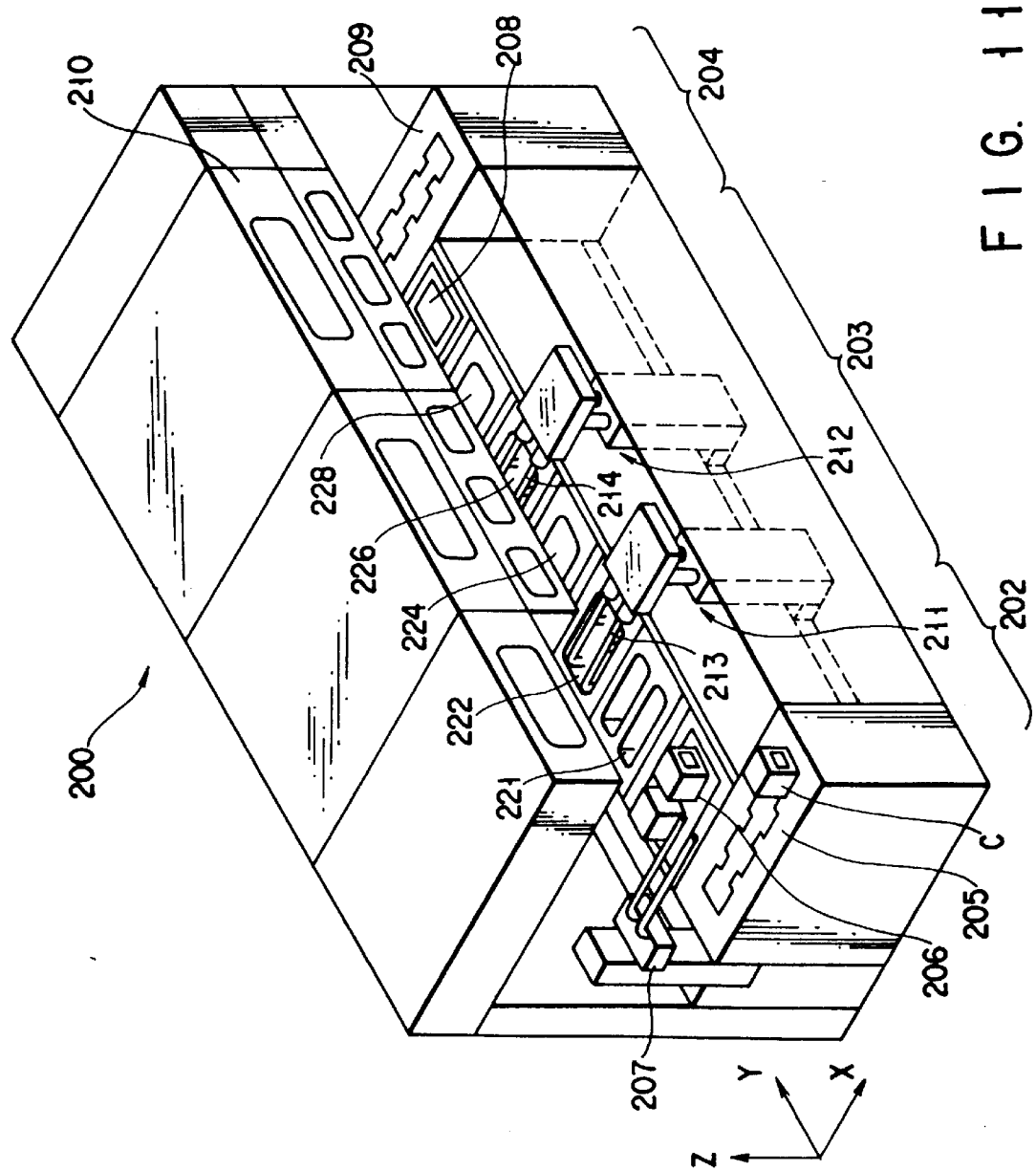
FIG. 11 is a perspective view of the outline of a substrate washing and drying apparatus having a second chemical solution/water washing process unit.

Next, the following will explain the other embodiment of the present invention with reference to FIG. 10.

The apparatus of this embodiment comprises the forcible discharge mechanism 60. There is formed the discharge port 61 opening to the entire bottom of the inner vessel 20a. The cover 64 is fluid-tightly coupled to the lower end portion of the inner vessel 20a through a seal ring, so that the discharge port 61 is blocked by the cover 64. The cover 64 of the forcible exhaust mechanism 60 is supported to be movable up and down by a hydraulic cylinder 65. The process vessel 20 is supported by a fixing member (not shown). The cover 64 has two supply/discharge ports 24.

According to the forcible discharge mechanism 60, HF solution of the inner vessel 20a can be immediately discharged, and the processing time can be reduced. Also, the adhesion of the particles to the wafers can be much surely controlled. Three or more supply/discharge ports 24 may be formed, or only one supply/discharge port 24 may be formed.

Next, the following will explain the other embodiment of the present invention with reference to FIGS. 11 to 15.

A washing and drying system 200 comprises a process section 203, a loader section 202, and an unloader section 203. The loader section 202 is provided at one side end portion of the process section 203, and the unloader section 204 is provided at the other end portion of the process section 203. The loader section 202 comprises a mount section 205, an interface section 206, and a transfer device 207. On the mount section 205, a plurality of cassettes C is mounted. In each cassette C, 25 unprocessed wafers W are contained. The transfer device 207 takes up the wafers W from the cassette C at one time to be positioned and transferred to the interface section 206. The interface section 206 is placed to be adjacent to the process section 203. The interface section is an interface area for delivering the wafers W from the transferring device 207 to a transfer mechanism 211.

Figure 12:
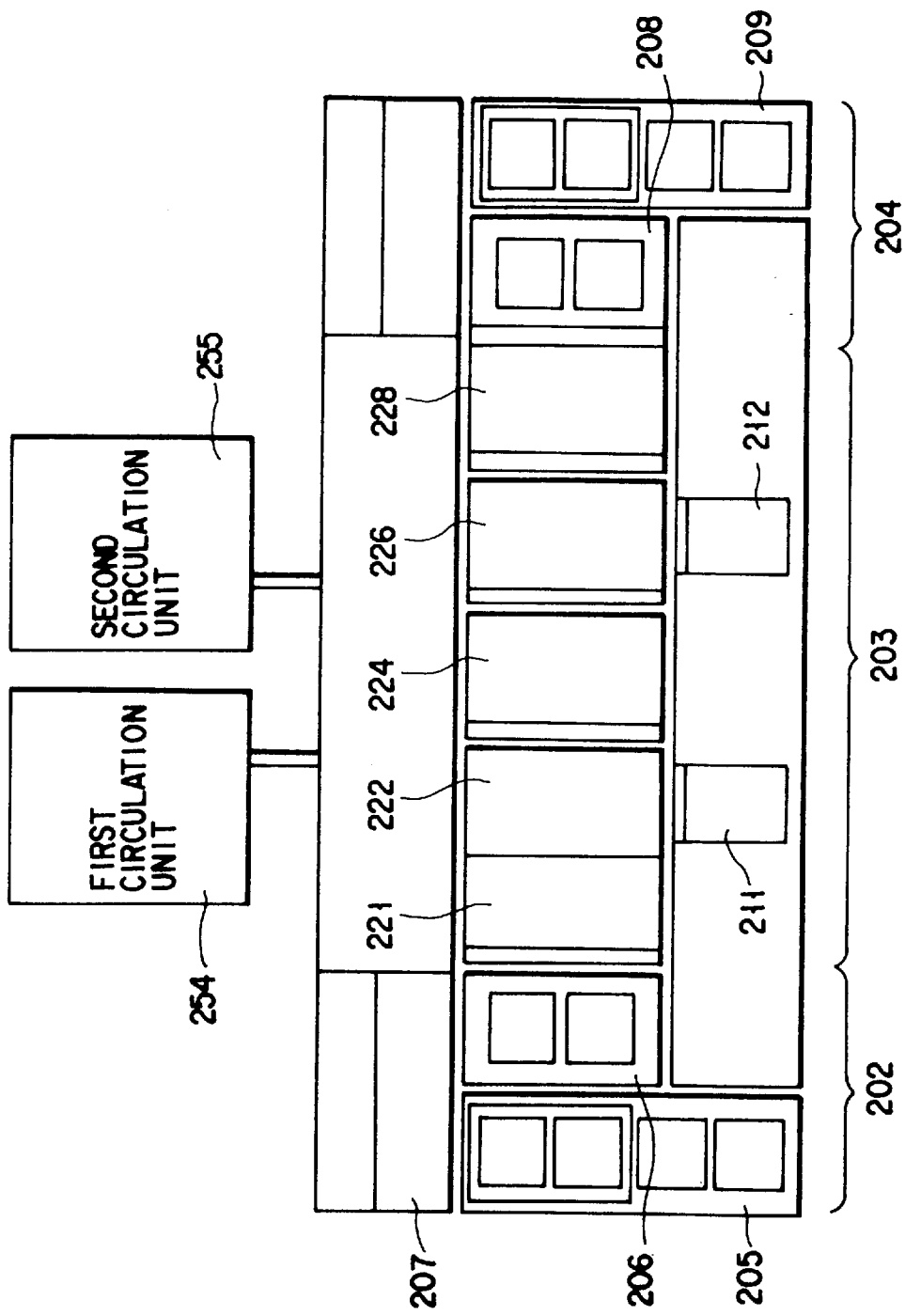
FIG. 12 is a plane block diagram showing the substrate washing and drying apparatus.

The process section 203 comprises a plurality of units 221 to 228 arranged in series in a Y-axial direction. Each unit has a chemical solution vessel and a water washing vessel. In the unit 221, a washing and drying process is subjected to a wafer chuck 213. In the first chemical solution/water washing process unit 222, the wafers W are washed with chemical solution such as hydrofluoric acid solution and dilute sulfuric acid, and further washed with water. In the second chemical solution/water washing process unit 224, the wafers W are washed with chemical solution such as ammonia hydrogen peroxide solution ($NH_4OH—H_2O_2—H_2O$) (APM process), and further washed with water. In the third chemical solution/water washing process unit 226, the wafers W are washed with chemical solution, which is different from the first and second chemical solution/water washing process units 222 and 224. Then, the wafers are further washed with water. The washing and drying unit 228 is provided at the mostdown stream side of the process section 203. In the unit 228, the wafers W are finally washed and an IPA drying process can be performed. As shown in FIG. 12, chemical solution and pure water are set to be circulated in each process vessel by first and second circulation units 254 and 255. In the case, the wafers may be dried in the unit 226 so as to omit the unit 228 from the process section 203.

Two transfer mechanisms 211 and 212 are provided along the process section 203 to be rotatable in the Y-axial direction. The transfer mechanisms 211 and 212 have wafer chucks 213 and 214 for chucking 50 wafers at one time, respectively. The wafer chucks 213 and 214 are movable to X- and Z-axes, and rotatable around the Z-axis at θ, respectively.

The unloader section 209 has a cassette mount potion 208. On the cassette mount portion 208, a plurality of cassettes C is mounted. In each cassette C, wafers W, to which the washing and drying process is subjected, are contained.

Figure 13:
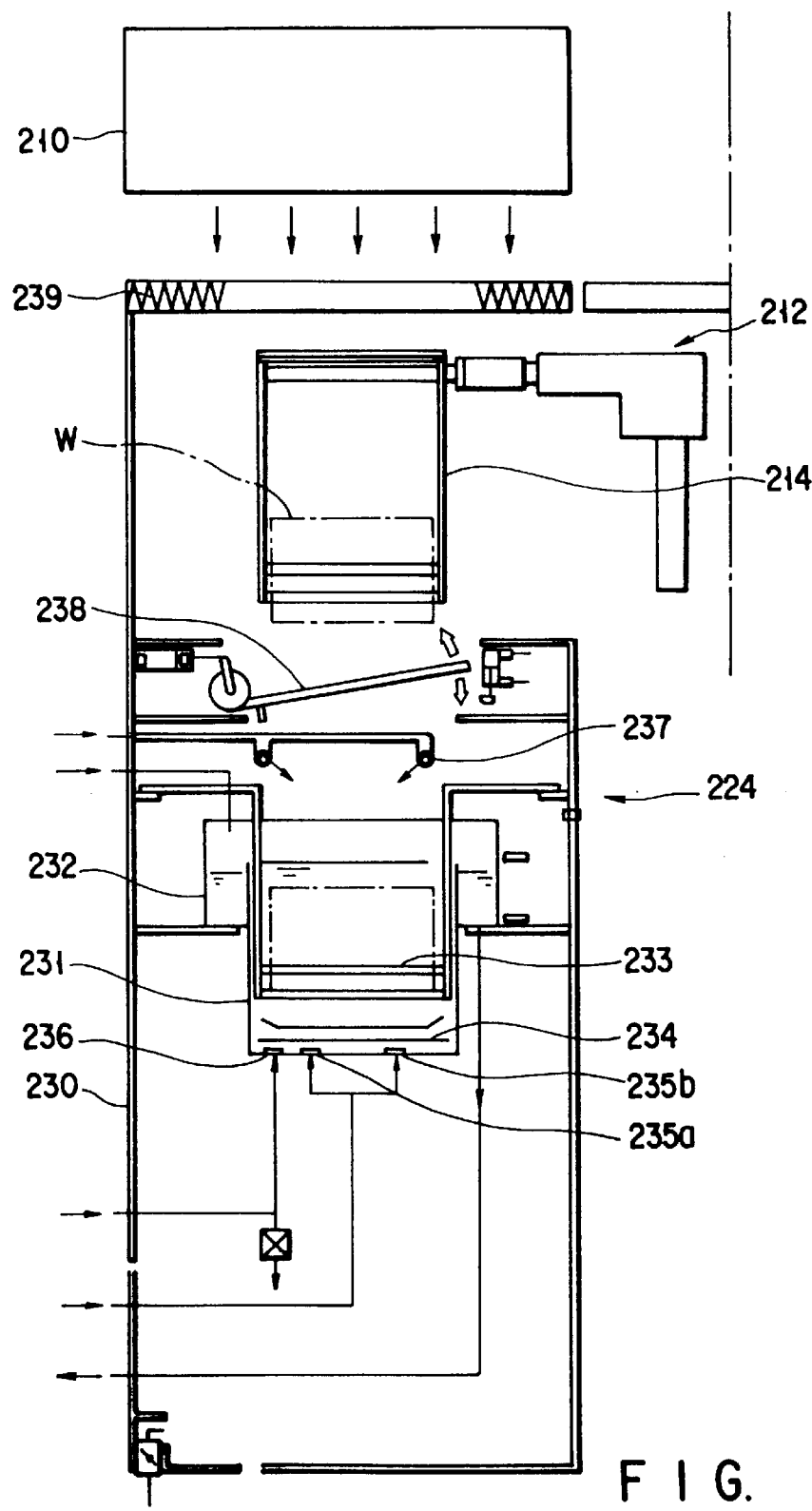
FIG. 13 is an internal perspective view showing the second chemical solution/water washing process unit seeing from the side.
Figure 14:
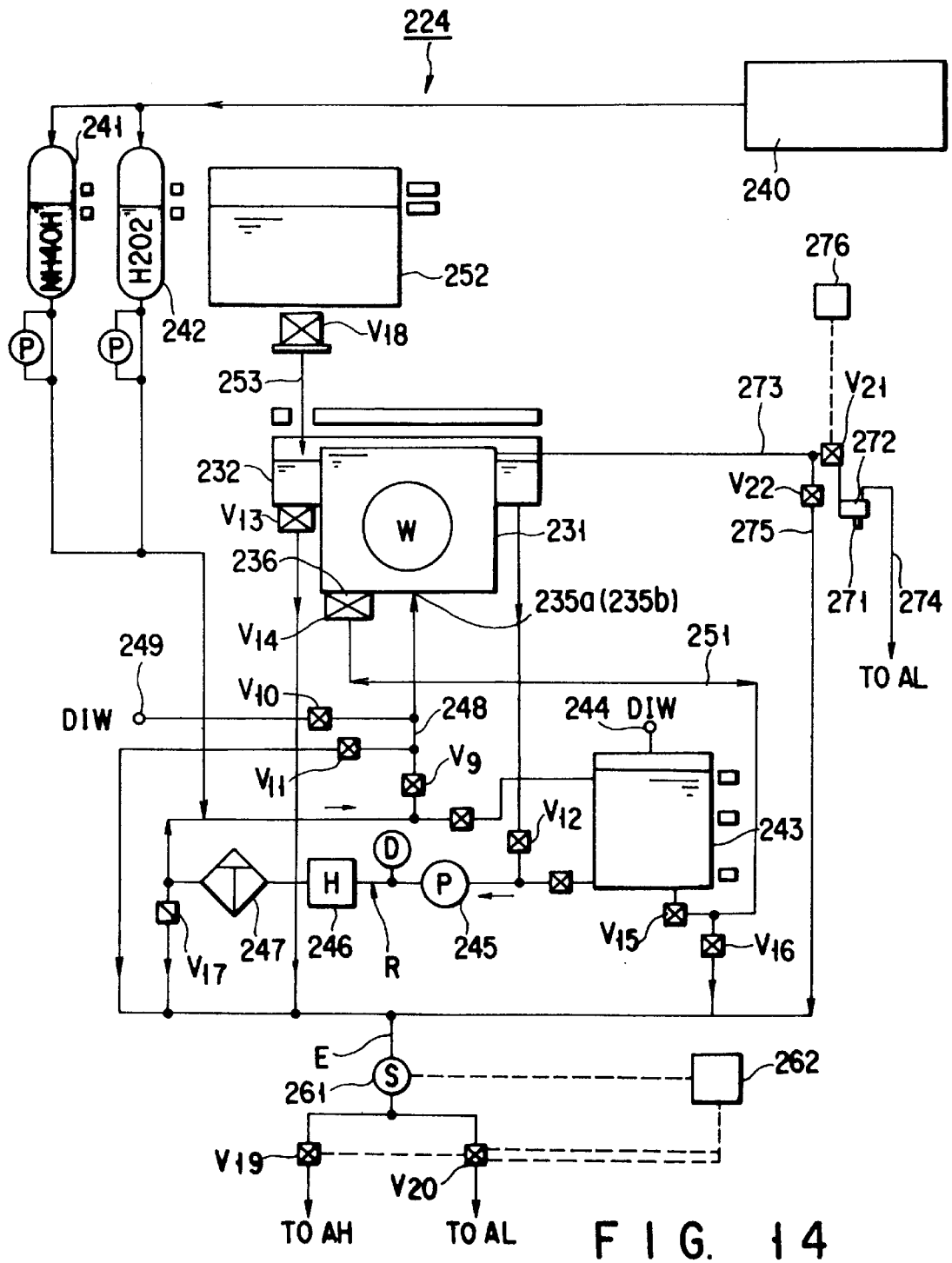
FIG. 14 is a block diagram showing the second chemical solution/water washing process unit and its peripheral circuit.
Figure 15:
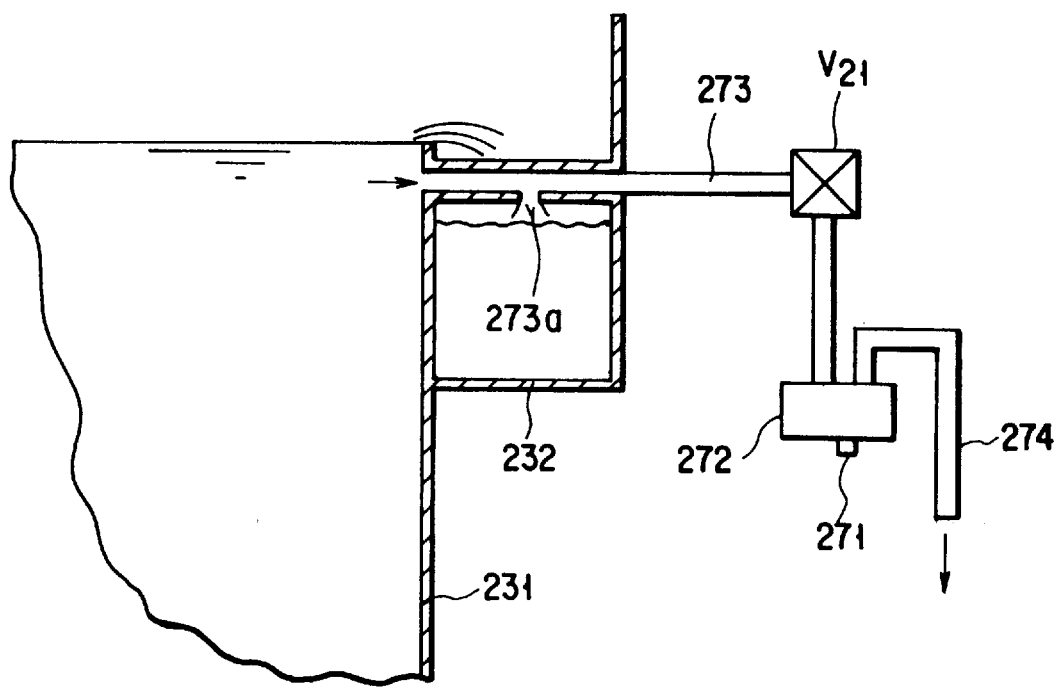
FIG. 15 is a circuit diagram showing a resistivity measuring device.
Figure 16:
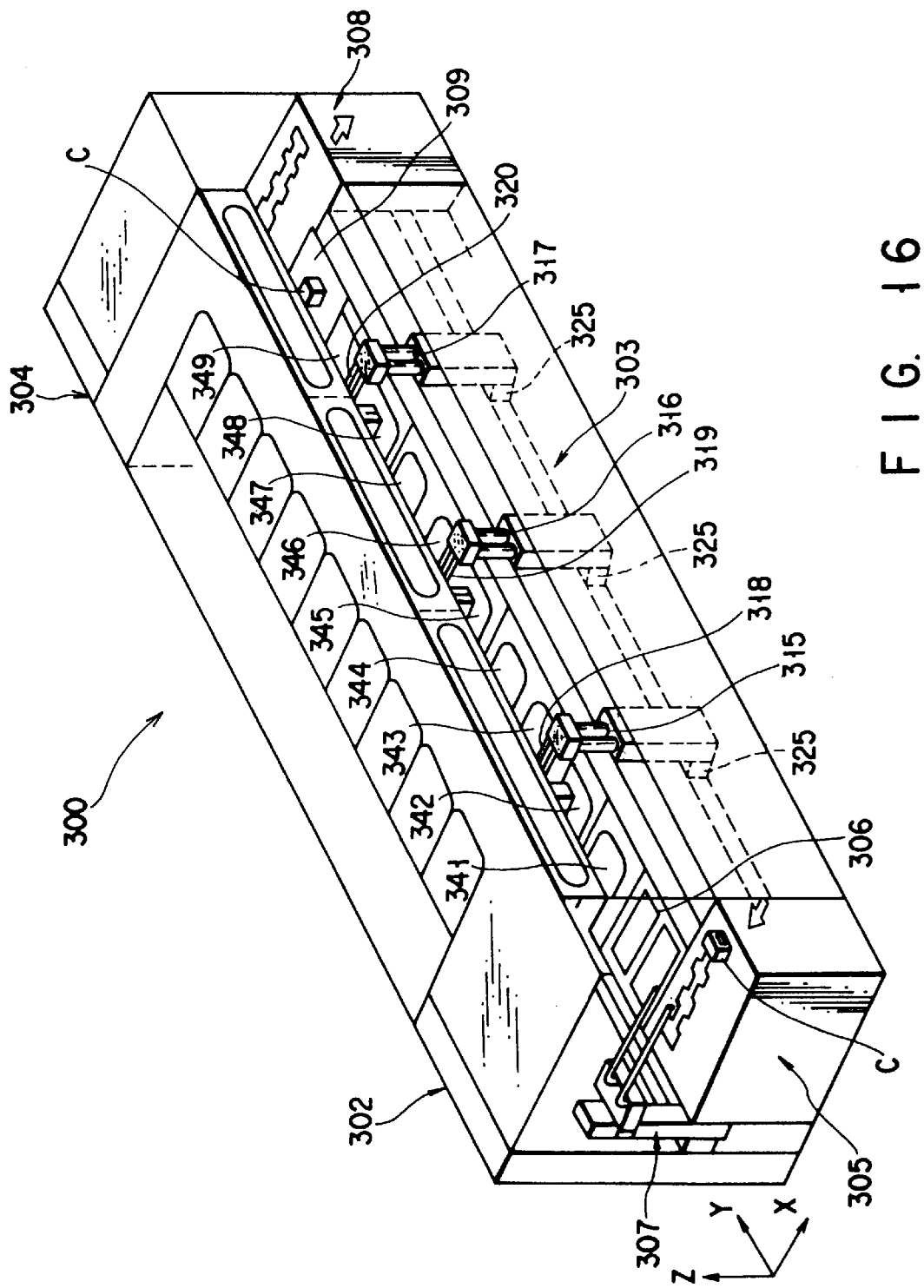
FIG. 16 is a perspective view showing the outline of the substrate washing and drying apparatus.

The following will explain the second chemical solution/ water washing process unit 224 with reference to FIGS. 13 to 15.

As shown in

FIG. 13, the main part of the second chemical solution/ water washing process unit 224 is surrounded by a substantially box-shaped casing 230 whose upper portion is opened. An openable and closable cover 238 is provided at the upper portion of the casing 230. The wafer chuck 214 of a transfer mechanism 212 is set at further upper portion. Then, a filter 239 is provided at further upper portion. A clean air supply device (air conditioner) 210 is provided the uppermost portion of the unit 224. According to the above-mentioned structure, down-flow is formed in the unit 224 by clean air flowing downward from the device 210.

An inner vessel 231 and an outer vessel 232 are provided in the casing 230. The outer vessel 232 is provided to surround the upper end of the inner vessel 231, and to receive pure water overflowing from the inner vessel 231.

A wafer boat 233 is provided in the inner vessel. The wafer boat 233 is substantially the same as the boat of the aforementioned embodiment. Then, 50 wafers are held thereon. A rectifying boat 234 is provided at the lower portion of the wafer boat 233. Then, supply ports 235a and 235b, and a discharge port 236 are provided just below the rectifying boat 234.

A plurality of spray nozzles 237 are arranged at the opening of the upper portion of the inner vessel 231, so that pure water 91 is sprayed to the wafers W of the inner vessel 231. A cover 238 is provided at the upper portion of the spray nozzles 237, so that the opening of the upper portion of the casing 230 is blocked. A filter 239 is provided at the upper portion of the cover 238. The air-conditioner 210 is provided at the upper portion of the filter 239. Then, down-flow of the clean air is supplied to the inner vessel 231 and the outer vessel 232 through the filter 239.

The following will explain each line of solution supply, exhaust, and circulation systems of the above-mentioned process unit 224 with reference to FIG. 14.

The process unit 224 comprises a chemical solution supply device 240 communicating with two tanks 241 and 242. Then, ammonia solution is reserved in the first tank 241, and hydrogen peroxide solution is reserved in the second tank 242. Each of ammonia solution and hydrogen peroxide solution sent from each of the tanks 241 and 242 is supplied to a supply line 248 at a predetermined ratio and a predetermined flow rate through a pump. In place of the pump supply, a gravity supply may be used.

On the bottom of the inner vessel 231, three supply ports 235a, 235b, and 236 are formed. The support ports 235a and 235b communicate with the first and second tanks 241 and 242 through the line 248. The support ports 235a and 235b also communicate with an adjusting tank 243 through a circulation line R. Pure water 91 is supplied to the adjusting tank 243 from the pure water supply source 244. Moreover, the supply port 236 communicates with the adjusting tank 243 through the line 251. Another pure water source 252 communicates with the outer vessel 232 through a line 253, so that pure water is supplied to the outer vessel 232.

Chemical solution is adjusted by the adjusting tank 243 as to be returned to the adjusting tank 243 through a heater 246 of the circulation line R and a filter 247 by a pump 245. During the circulation of chemical solution through the line R, the temperature of chemical solution is adjusted. As a result, chemical solution is filtered and purified. Thus, the so-called APM washing process is subjected to the wafers W with the mixing solution of ammonia and hydrogen peroxide, which is circulated in the inner vessel 231 through the circulation line R.

The supply line 248 is formed between the filter 247 and the adjusting tank 243. The supply line 248 communicates with the supply ports 235a and 235b through a valve $V_9$. Pure water (DIW) is supplied to the supply line 248 from the supply line 248 through a valve $V_{10}$. Further, the supply line 248 communicates with an waste solution exhausting line E through a valve $V_{11}$.

The overflow line of the outer vessel 232 is connected to the circulation line R through a valve $V_{12}$. The overflow line of the outer vessel 232 is also connected to the waste solution exhausting line E through a valve $V_{13}$. The discharge port 236 communicates with the adjusting tank 243 through a valve $V_{14}$ by the line 251. The adjusting tank 243 communicates with the waste solution exhausting line E through a valve $V_{15}$, $V_{16}$, and the line 251 communicates with the waste solution exhausting line E through a valve $V_{16}$. Moreover, solution, which is sent from the circulation line R via the filter 2471, flows to the waste solution exhausting line E through a valve $V_{17}$.

Pure water is rapidly supplied to the outer vessel 232 from the tank 252 through the line 253. As shown in FIG. 12, the tank 252, the circulation line R, and the adjusting tank 243 are contained in the circulation units 254 and 255.

In the waste solution exhausting line E, there is provided a concentration sensor 261 for detecting the concentration of a specific component included in the waste solution. A concentration detecting signal is sent to a controller 262 from the concentration sensor 261. If a detected concentration exceeds a predetermined threshold value, the controller 262 opens a valve $V_{19}$ to flow the waste solution to a concentrated waste solution exhaust line AH. If a detected concentration is less than a predetermined threshold value, the controller 262 opens a valve $V_{20}$ to flow exhaust solution to a dilute waste solution exhaust line AL. Thus, the exhaust solution can be selectively made to flow the line AH or the line AL in accordance with the concentration of the exhaust solution flowing to the waste solution exhaust line E. In this case, a pH measuring device, a detector for detecting concentration of hydrofluoric acid, a resistivity measuring device, conductivity measuring device, etc., are used as concentration sensor 261.

A discharge line 273, which communicates with a cell 272 having a resistivity measuring device 271, is connected to a portion close to an upper end portion of the inner vessel 231. An exhaust pipe 274, which communicates with the exhaust line AL, is connected to the downstream side of the cell 272. In the discharge line 273, a valve $V_{21}$ is provided at the upperstream side of the cell 272. A drain 275, which communicates with the waste solution exhaust line E, is provided at the upperstream side of the valve $V_{21}$. An arbitrary valve $V_{22}$ is provided at the drain 275. In this case, exhaust solution may be directly exhausted to the line AH from the drain 275.

The valve $V_{21}$ is controlled to be interlocked with the valve $V_{22}$ by a controller 276.

For example, the valve $V_{21}$ is closed and the valve $V_{22}$ is opened for a certain period of time after solution starts to flow to the discharge line 273. After passing a predetermined period of time, the valve $V_{21}$ is opened, and the valve $V_{22}$ is closed. The controller 276 controls the opening and closing of the valves V21 and V22 based on not only the above-mentioned time control but also the detected concentration of the solution passing through the discharge line 273. Specifically, if the concentration detecting signal sent from a concentration sensor (not shown) of the discharge line 273 exceeds a predetermined value, the controller 276 closes the valve $V_{21}$ and opens $V_{22}$. If the concentration detecting signal is less than a predetermined value, the controller 276 opens the valve $V_{21}$ and closes $V_{22}$.

Next, the following will explain a case in which the washing process is subjected to the wafers W are washed.

The wafer chuck 214 is moved to the inner vessel 231 to mount the wafers W on the wafer boat 233. In the inner vessel 231, there is contained chemical solution whose concentration is adjusted. The wafers W are dipped in chemical solution. The chemical solution is passed through the line R to be circulated in the inner vessel 231, so that the wafers W are washed for only a predetermined period of time.

If the chemical washing process is ended, chemical solution is discharged from the inner vessel 231 through the line 251, so that the discharged chemical solution is collected into the adjusting tank 243. Next, pure water 91 is sprayed to the wafers W from the spray nozzle 237. At the same time, pure water 91 is rapidly supplied to the outer vessel 232 or the inner vessel 231 from the tank 252 through the line 253. As a result, the wafers W and the inner vessel 231 are filled with pure water.

The process solution may be supplied to the inner vessel 231 from the lower portion thereof.

Thus, if the inner vessel 231 is filled with solution, pure water 91 is supplied to the inner vessel 231 from the supply ports 235a and 235b. As a result, solution to be supplied from the inner vessel 231 to the outer vessel 232 is overflowed, the component of the solution of the inner vessel 231 is changed to the component, which is near pure water. Then, the valve $V_{13}$ is opened to flow the overflow solution to the waste solution discharging line E from the outer vessel 232. The wafers W are continued to be washed with pure water until the resistivity value of the overflow solution is less than a predetermined value.

In the conventional case, the overflow solution of the first half of the water washing process was directly made to flow to the resistivity measuring device 271. As a result, the device 271 contacted the chemical solution included in the overflow solution, and the device 271 was corroded. However, in the present invention, the measuring solution can be taken up through the line 272 different from the overflow line. As a result, the resistivity value can be detected at the timing of the second half of the water washing process. Thus, after the concentration of the component of the chemical solution in the measuring solution of the inner vessel 231 is sufficiently reduced, it is possible to flow the measuring solution to the resistivity measuring device 271. As a result, no corrosion is generated in the resistivity measuring device 271. As shown in FIG. 15, a hole 273a communicating with the outer vessel 232 is formed on the passage of the discharge line 273. Then, residual solution staying in the discharge line 273 may be set to flow to the outer vessel 232 through the hole 273a. As a result, the resistivity measuring device 271 can be further prevented from being corroded.

The overflow solution of the first half of the water washing process is made to flow to the concentrated waste solution exhaust line AH. The measuring solution of the second half of the water washing process is made to flow to the dilute waste solution exhaust line AL. Thus, the exhaust solution line facilities common to the plant side can be efficiently used. Also, the exhaust solution having high concentration can be prevented from flowing to the line AL. The water washing process is ended at the time when the resistivity value of the solution of the inner vessel 231 exceeds a predetermined value. Then, the wafers W are transferred to the process unit of the next process by the wafer chuck 15 of the transfer device 12.

Only one kind of mixing chemical solution (ammonia+hydrogen peroxide+pure water) and pure water flow to the line 248 for supplying chemical solution to the inner vessel 231. As a result, no cross-contamination is generated in the inner vessel 231 and the line 248.

After the washing processing with only one kind of process solution, only the water washing process is performed. As a result, the so-called cross-contamination is not generated in the process vessel. Even in the exhaust solution line E, no cross-contamintation is generated. Moreover, since only one kind of process solution is used, the degree of purification of the process solution can be maintained and the process solution can be reused by circulating and filtering the process solution. Since the water washing process can be, of course, performed, the chemical washing process and the water washing process can be continuously performed in the same process vessel. In this case, not only the single chemical solution but also the mixing chemical solution mixing the chemical solution having a plurality of different components is included in "one kind of the process solution."

In this case, the "concentrated waste solution exhaust line" means a line, which flows the waste solution having relatively high concentration. The "dilute waste solution exhaust line" means a line, which flows the waste solution having relatively low concentration. Thus, the exhaust lines AH and AL are provided, the efficient use of the lines common to the plant side can be improved, and the manufacturing cost can be reduced.

Moreover, the erroneous measurement of the resistivity measuring device, and the corrosion of the resistivity measuring device can be prevented.

Next, the following will explain the other embodiment of the present invention with reference FIGS. 16 to 21 and equations 1 and 2.

A washing and drying system 300 comprises a process section 303, a loader section 302, and an unloader section 303. The loader section 302 is provided at one side end portion of the process section 303, and the unloader section 304 is provided at the other end portion of the process section 303.

The loader section 302 comprises a mount section 305, an interface section 306, and a transfer device 307. On the mount section 305, a plurality of cassettes C is mounted. In each cassette C, 25 unprocessed wafers W are contained. The transfer device 307 takes up the wafers W from the cassette C at one time to be positioned and transferred to the interface section 306. The interface section 306 is placed to be adjacent to the process section 303. The interface section is an interface area for delivering the wafers W from the transferring device 307 to a transfer mechanism 315.

The process section 303 comprises a plurality of units 341 to 349 arranged in series in a Y-axial direction. Each unit has a chemical solution vessel and a water washing vessel. In the unit 341, a washing and drying process is subjected to a wafer chuck 318. In the first chemical solution/water washing process unit 342, the wafers W are washed with ammonia hydrogen peroxide solution ($NH_4OH$—$H_2O_2$—$H_2O$). In other words, the so-called SC1 washing process is subjected to the wafers W. In the SC1 washing process, organic matters and particles are removed from the wafers. In the second chemical solution/water washing process unit 344, the so-called HF washing process is subjected to the wafers W with hydrogen fluoride solution ($HF$-$H_2O$). In the HF washing process, the natural oxide film and the metallic impurity materials are removed from the wafers W. In the third chemical solution/water washing process unit 346, the so-called SC2 washing process is subjected to the wafers W with hydrochloric acid hydrogen peroxide solution ($HCl$—$H_2O_2$—$H_2O$). In the SC2 washing process, a clean natural oxide film having no impurity material is grown on the surface of each wafer as removing the metallic impurity materials from each wafer W. In this case, a series of processes, including the SC1 washing process to the SC2 washing process through the HF washing process, is called "RCA washing process."

Three transfer mechanisms 315, 316, 317 are provided along the process section 303 to be rotatable in the Y-axial direction. The transfer mechanisms 315, 316, and 317 have wafer chucks 318, 319, and 320 for chucking 50 wafers W at one time, respectively. The wafer chucks 318, 319, and 320 are movable to X- and Z-axes, and rotatable around the Z-axis at θ, respectively.

The unloader section 304 has a cassette mount potion 308. On the cassette mount portion 308, a plurality of cassettes C is mounted. In each cassette C, wafers W, to which the washing and drying process is subjected, are contained.

Figure 17:
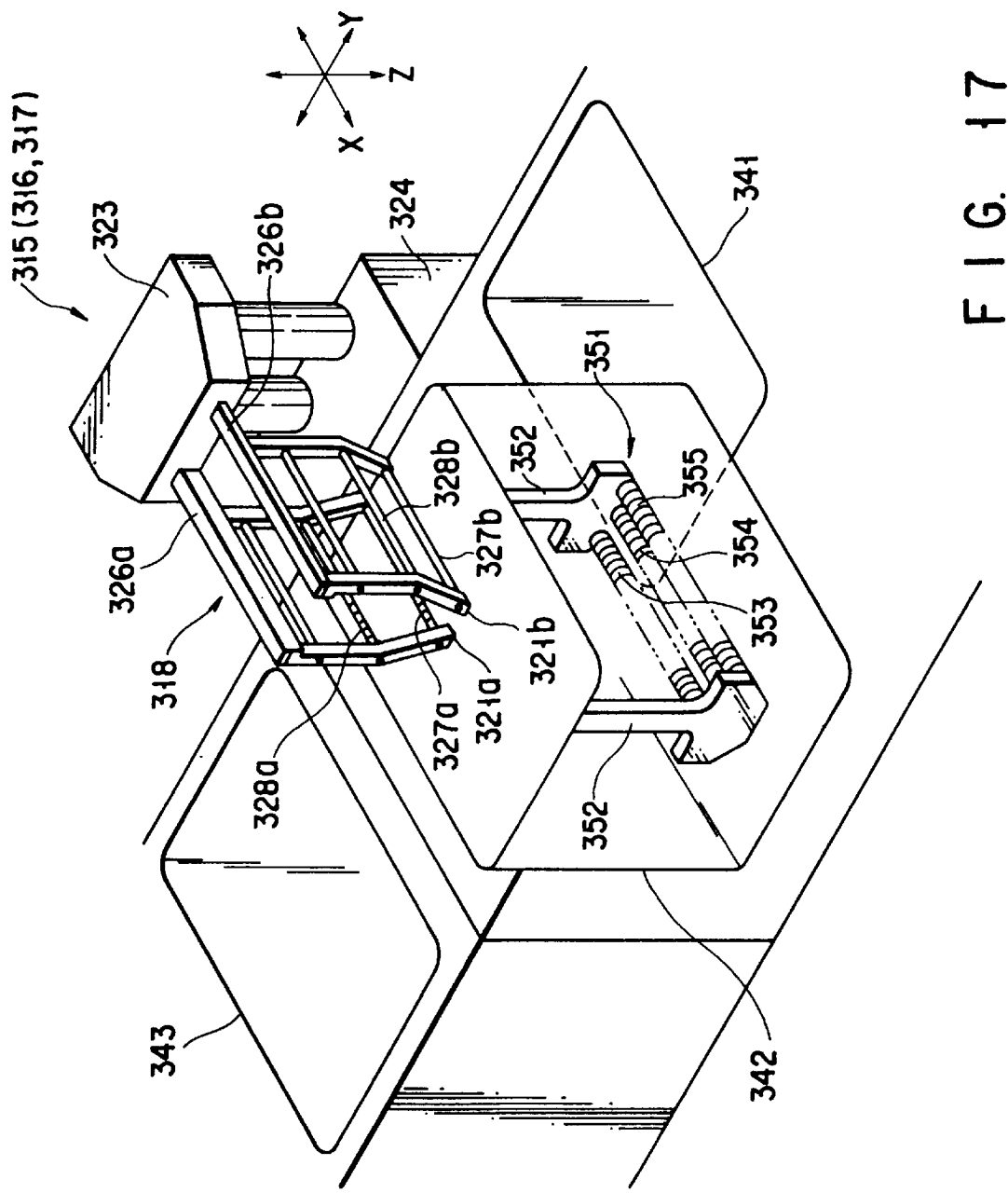
FIG. 17 is a perspective view showing a wafer chuck transfer device.

As shown in FIG. 17, the wafer chuck 318 comprises a pair of holding members 321a, 321b for holding 50 wafers W at one time. The holding members 321a and 321b are supported by a support 323 through rotation shafts 326a and 326b. Each of the rotation shades 326a and 326b is rotated around the horizontal axis at θ by a θ rotation driving mechanism (not shown), which is built in the support 323. The support 323 itself is moved in a Z-axial direction by a lift mechanism 324.

The wafer chuck 318 itself is moved in an X-axial direction by a driving mechanism (not shown), which is built in the support 323. The lift mechanism 324 itself is mounted on a transfer base 325, which is movable to a Y-axial direction. The angle of the support 323 can be finely adjusted in the horizontal plane.

The upper end portions of arms 321a and 321b are fixed to the rotation shafts 326a and 326b, respectively. Then, chuck rods 327a, 327b are horizontally attached to the lower end portion of the arms 321a. Also, chuck rods 328a, 328b are horizontally attached to the lower end portion of the arms 321b. Each of the chuck rods 327a, 327b, 328a and 328b has 50 grooves for holding the wafers.

As shown in FIG. 18, a wafer boat 351 is provided in each of the process vessels 342 to 347. For example, in the case of the process vessel 342, the wafer boat 351 comprises a pair of vertical members 352, and three holding rods 353, 354, and 355. These holding rods 353, 354, and 355 are provided between the pair of the vertical members 352. Each of the holding rods 353, 354, and 355 has 50 grooves for holding wafers. In this case, the pitch distance between the grooves of the holding rods and the pitch distance between the grooves of the chuck rods are the same as the pitch distance P between the grooves of the cassette C, or the half of the pitch distance P between the grooves of the cassette C.

Next, the following will explain the process vessel 342 in which SC1 washing is subjected to the waters W with reference to FIGS. 18 to 21.

The main body 361 of the process vessel 342 is box-shaped. Then, process solution for SC1 washing, which is heated at high temperature, is supplied to the main body 361 through the supply port 363 of a bottom 362. There is provided rectifying means 364 having a rectifying boat 365 and a diffusion boat 366 between the boat 351 and the bottom 362. The diffusion boat 366 is positioned just above the supply port 363. The rectifying boat 365 is positioned just above the diffusion boat 366. A plurality of slits 367 and a plurality of small holes 367a are formed on the rectifying boat 365. By the rectifying boat 365, the process solution is equally supplied to the surroundings of the wafers W without generating turbulence.

Figure 19:
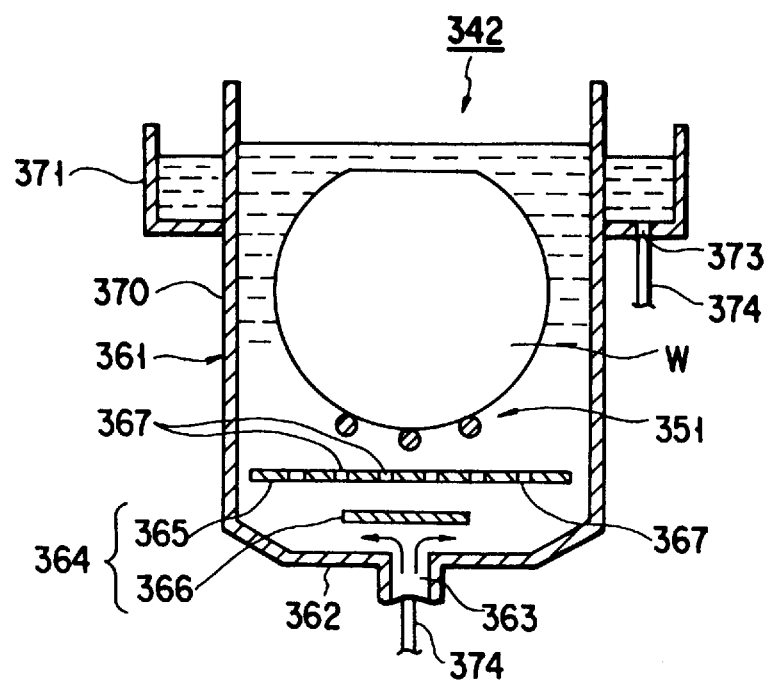
FIG. 19 is a cross-sectional view showing the process vessel longitudinally cut along a Y-axis.
Figure 20:
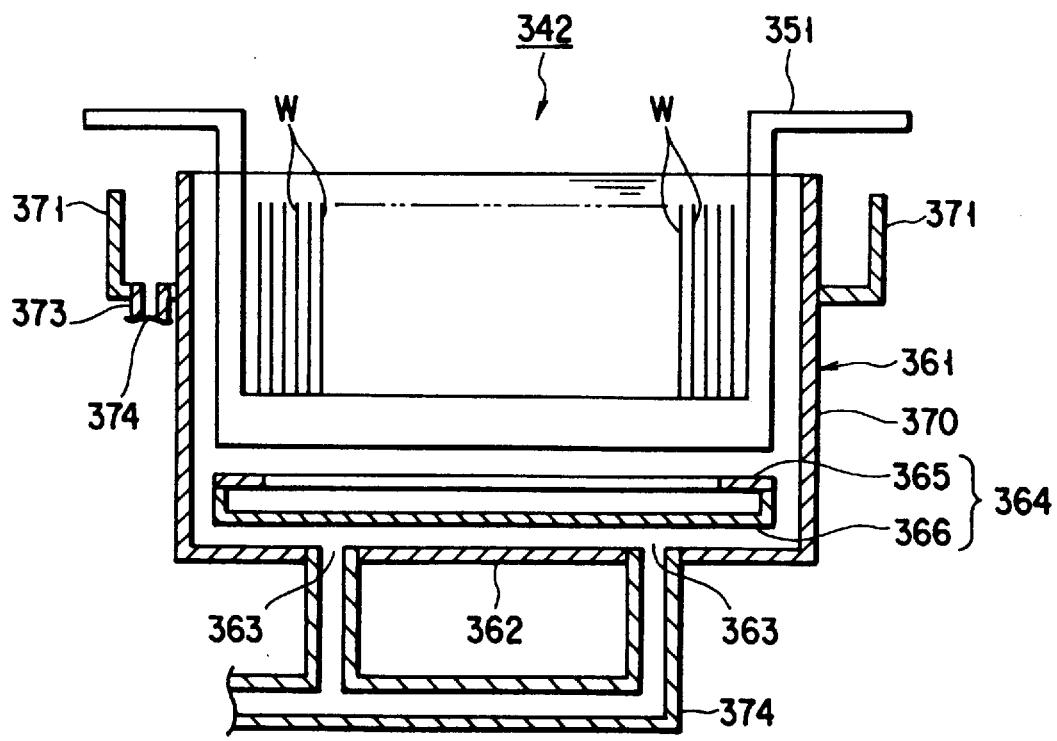
FIG. 20 is a cross-sectional view showing the process vessel longitudinally cut along an X-axis.

As shown in FIGS. 19 and 20, the main body 361 of the process vessel comprises an inner vessel 370 and an outer vessel 371. The inner vessel 370 has a capacity, which is sufficient for containing the boat 351 and the wafers W. The outer vessel 371 is formed to surround the outer periphery of the upper portion of the inner vessel 370 and to receive overflowing process solution. An discharge port 373 is formed at the bottom of the outer vessel 371. The discharge port 373 communicates with the supply port 363 through a circulation line 374.

As shown in FIG. 21, the circulation line 374 is provided between the discharge port 373 of the outer vessel 371 and the supply port 363 of the inner vessel 370. The circulation line 374 comprises a pump 380, a dumper 381, a heater 382, and a heater 383. In a case where the process solution contains hydrogen peroxide, gas is easily stored in the filter 383, so that there is possibility that efficiency of filtration will be lowered. To prevent such a problem, a vent line 384 for degasing is provided at the upper portion of the filter 383. The vent line 384 communicates with the outer vessel 371.

In the circulation line 374 between the dumper 381 and the heater 382, a bypass line 385 for measuring concentration is branched. The washing process solution taken up from the circulation line 374 between the dumper 381 and the heater 382 is returned to the outer vessel 371 through the bypass line 385. The bypass line 385 comprises a valve 386, a heat exchanger 387, an infrared absorptance densitometer 388, and a valve 389.

If the valves 386 and 389 are opened, the process solution flows into the bypass line 385 from the circulation line 374. The process solution is adjusted to be a predetermined temperature. Then, the concentration of the process solution is measured by the infrared absorptance densitometer 388. Thereafter, the process solution is returned to the outer vessel 371. A pure water supply line 391 having a valve 390 communicates with a portion between the valve 386 and the heat exchanger 387 to supply pure water to the bypass line 385. A drain line 393 having a valve 392 communicates with a portion between the infrared absorptance densitometer 388 and the valve 389 to exhaust solution from the bypass line 385.

A chemical solution replenishing unit 400 comprises solution replenishing systems 403, 406, and 409, which are necessary for executing the SC1 washing. The first solution replenishing system 403 has a tank 401 for ammonia solution and a pump 405. The second solution replenishing system 406 has a tank 404 for hydrogen peroxide and a pump 405. The third solution replenishing system 409 has a tank 408 for pure water (DIW) and a valve 407. The chemical solution having a predetermined concentration of the component to the outer vessel 371 from the first to third replenishing systems 403, 406, and 409 through the nozzle (not shown). Moreover, an instruction signal is output to the unit 400 from the first controller 421 of a control section 420. The operations of the pumps 402, 405, and the valve 407 are controlled based on the instruction signal.

The control section 420 comprises first and second controllers 421 and 422, a CPU 423, and a detector 424 for detecting a liquid surface level. The second controller 422 controls the infrared absorptance densitometer 388 of the bypass line 385 to send a concentration measuring signal to the CPU 423. The detector 424 has an $N_2$ sensor for detecting the liquid surface level of the outer vessel 371 or an optical sensor within to send a liquid surface level detection signal to the CPU 423.

The CPU 423 determines the concentration of the replenishing solution to the outer vessel 371, an amount of supply, a supply timing based on the received signal. Then, the determined data is sent to the first controller 421. The CPU 423 also determines the measuring timing of the detector 424, so that the determined data is sent to the detector 424.

The CPU 423 performs the calculation by use of detection data and the following equations (1) and (2) to determine the amount of solution to be replenished to the process vessel 422, and to output the instruction signal to the replenishing unit 400. The unit 400 supplies $NH_4OH$, $H_2O_2$, pure water to the outer vessel 371, so that the concentration and the amount of the solution circulating in the process vessel 342 are set as target values.

$$\Delta V^B_{NH4OH}(T1) = \frac{1}{0.89 \times 0.28} \left[ \beta_{NH4OH \times} V(T0) - C^{100}_{NH4OH}(T1) \frac{1}{\alpha(T1)} V(T1) \right] \quad (1)$$

$$\Delta V^B_{H2O2}(T1) = \frac{1}{1.11 \times 0.31} \left[ \beta_{H2O2 \times} V(T0) - C^{100}_{H2O2}(T1) \frac{1}{\alpha(T1)} V(T1) \right]$$

$$\Delta V^B_{H2O}(T1) = \left[ \beta_{H2O \times} V(T0) - [1 - C^{100}_{NH4OH}(T1) - C^{100}_{H2O2}(T1)] \frac{1}{\alpha(T1)} V(T1) \right] -$$
$$\frac{0.72}{0.28} \left[ \beta_{NH4OH \times} V(T0) - C^{100}_{NH4OH}(T1) \frac{1}{\alpha(T1)} V(T1) \right] -$$
$$\frac{0.69}{0.31} \left[ \beta_{H2O2 \times} V(T0) - C^{100}_{H2O2}(T1) \frac{1}{\alpha(T1)} V(T1) \right]$$

$$\alpha(T1) = 1 + \frac{1}{0.28}\left(\frac{1}{0.89} - 1\right) C^{100}_{NH4OH}(T1) + \frac{1}{0.31}\left(\frac{1}{1.11} - 1\right) C^{100}_{H2O2}(T1) \quad (2)$$

$$\beta_{NH4OH} = 0.28 \times 0.89 \times \frac{H^B_{NH4OH}}{H}$$

$$\beta_{H2O2} = 0.31 \times 1.11 \times \frac{H^B_{H2O2}}{H}$$

$$\beta_{H2O} = \frac{H^B_{H2O}}{H} + 0.72 \times 0.89 \times \frac{H^B_{NH4OH}}{H} + 0.67 \times 1.11 \times \frac{H^B_{H2O2}}{H}$$

wherein symbols used in the equations (1) and (2) are explained as follows.

$\Delta V^B_{NH4OH}$ (T1) is the volume of ammonia solution to be replenished at a certain time T1. The specific gravity of ammonia solution is 0.89, and the concentration is 0.28.

$\beta_{NH4OH}$ is a coefficient (constant value) given by equation (2).

V (T0) is a volume (constant value) of the process solution first contained in the process vessel before the process is started.

$C^{100}_{NH4OH}$ (T1) is the mass concentration (wt. %) of 100% ammonia solution at a certain time T1. The mass concentration value is measured by the infrared absorptance densitometer 388.

$\alpha$ (T1) is a coefficient (constant value) given by equation (2) using the concentration of ammonia solution and that of hydrogen peroxide at a certain time T1.

V (T1) is the capacity of the entire process solution at a certain time T1. The capacity of the entire process solution is measured by the liquid surface level measuring device 424.

$\Delta V^B_{H2O2}$ (T1) is the capacity of hydrogen peroxide to be replenished at a certain time T1. The specific gravity of hydrogen peroxide is 1.11, and the concentration is 0.31.

$\beta_{H2O2}$ is a coefficient (constant value) given by equation (2).

$C^{100}H_2O_2$ (T1) is the mass concentration (wt. %) of 100% hydrogen peroxide solution at a certain time T1. The mass concentration value is measured by the infrared absorptance densitometer 388.

$\Delta V^B_{H2O}$ (T1) is the capacity of pure water to be replenished at a certain time T1.

$\beta_{H2O}$ is a coefficient (constant value) given by equation (2).

$H^B_{NH4OH}/H$ is a ratio of ammonia solution to the entire process solution. In this embodiment, the target value of the ratio is set to 1/7.

$H^B_{H2O2}/H$ is a ratio of hydrogen peroxide solution to the entire process solution. In this embodiment, the target value of the ratio is set to 1/7.

$H^B_{H2O}/H$ is a ratio of pure water to the entire process solution. In this embodiment, the target value of the ratio is set to 5/7.

The CPU 423 adjusts the component ratio of the process solution in the process tank 342 to be set to $NH_4OH:H_2O_2:H_2O=1:1:5$.

In other words, the CPU 423 calculates the amount of each component to be replenished by use of variation data of the concentration of the process solution and the liquid level, so that the instruction signal is sent to the first controller 421. The first controller 421 outputs the instruction of the operation to the unit 400 at a predetermined timing. Then, the unit 400 replenishes the chemical solution having a predetermined amount and a predetermined concentration to the process vessel 342 based on the instruction of the operation. As a result, the chemical solution of the process vessel 342 is controlled to the target component ratio.

The first controller 421 controls the instruction of the operation output to the unit 400 to be fed back to the CPU 423. A plurality of the operations for replenishing the process solution. Thereafter, the CPU 423 performs the calculation by the actual performance values, so that the concentration of the solution and the amount to be replenished next time can be determined. In other words, the CPU 423 obtains a change on standing of the concentration of the process solution circulating in the main body 361 of the process vessel as a function by a least square method, an averaging method, etc. Then, the concentration of the solution and the amount to be replenished next time can be determined by the obtained function.

The following will explain a case in which the washing process is subjected to the wafers W by the above-mentioned apparatus.

50 wafers W are transferred to the process vessel 342. In the inner vessel 370 of the process vessel 342, there is contained the process solution for SC1 washing to which temperature control is subjected. The wafers W are mounted on the boat 351 of the inner vessel 370 from the chuck 318. The process solution is overflowed to the outer vessel 371 as being supplied to the inner vessel 370 so as to form an upward flow of the process solution around the wafers W. As a result, the process solution contacts the surface of each wafer W so as to remove the adhered organic matter from the wafers W.

In this case, for performing SC1 washing satisfactorily, it is important that the ratio among ammonia solution, hydrogen peroxide solution, and pure water be set to 1:1:5. Also, it is important that a predetermined amount of process solution be contained in the inner vessel 370. However, the concentration of each of the ammonia solution, hydrogen peroxide solution is gradually reduced as the process advances. Particularly, the lost of the ammonia solution is largely increased by its evaporation, and its concentration is rapidly reduced. For example, if the same process is repeated, the ratio among ammonia solution, hydrogen peroxide solution, and pure water is changed to 0.5:0.6:4.9. At this time, the large amount of process solution is carried away together with the wafers, so that the amount of the process solution of the inner vessel 370 is reduced.

According to the apparatus of this embodiment, the concentration of the bypass line 385 is measured by the infrared absorptance densitometer 388, so that the measured concentration is input to the CPU 423 through the second controller 422. On the other hand, the liquid surface level of the process solution of the outer vessel 371 is detected by the detector 424, so that the detected level is input to the CPU 423. The CPU 423 calculates the liquid level of the solution to be replenished and the concentration by input data and equations (1) and (2), and sends the instruction of the calculated liquid level and the concentration to the first controller 421. Further, the instruction of the operation is output to the unit 400 from the first controller 421, so that the process solution is newly replenished to the outer vessel 371 from the unit 400. Thus, each of the concentration and the amount of the process solution circulating in the process vessel 342 is maintained to be a predetermined value.

After SC1 washing of 50 wafers W is ended, the wafers S are washed with pure water in the next process vessel 343. Then, the wafers W are taken out from the process vessel 343, and sequentially transferred to the respective process vessels 344 to 347. Then, HF washing process is subjected to the wafers W. Finally, the wafers W are dried in the process vessel 349, and contained in each of the cassettes C of the unloader 304 so as to be delivered to the outside of the apparatus.

According to the apparatus of the present invention, since the concentration of each process solution of the process vessel and the amount of the solution are maintained to be in a suitable state, the reduction of the washing efficiency can be prevented. As a result, the apparatus can be continuously operated stably for a long period of time. Also, the apparatus can have a considerable good maintenance.

Moreover, since the wasteful consumption of chemical solution can be prevented, the running cost of the apparatus can be reduced.

Additional advantages and modifications will readily occur to those skilled in the art. Therefore, the invention in its broader aspects is not limited to the specific details, and representative embodiments shown and described herein. Accordingly, various modifications may be made without departing from the spirit or scope of the general inventive concept as defined by the appended claims and their equivalents.

What is claimed is:

1. A substrate washing and drying apparatus comprising:
    a processing section having a capacity to accommodate a boat for holding a plurality of substrates such that the substrates are upright;
    a supply/discharge port provided on a lower portion of the processing section;
    first process solution supplying means for supplying a first process solution into said processing section through said supply/discharge port for washing the substrates;
    second process solution supplying means for supplying a second process solution into said processing section through said supply/discharge port for washing the substrates;
    process solution discharging means for discharging at least one of said first and second process solutions from said processing section through said supply/discharge port;
    a drying vapor generating section having heating means for generating vapor for drying;
    a drying vapor supply passage communicating with each of said drying vapor generating section and said processing section for supplying said vapor for drying to said processing section;

a forcible discharging solution mechanism provided at the lower portion of said processing section and having at least one opening for rapidly discharging the process solution from said processing section when said at least one opening is unblocked;

a resistivity measuring device for detecting a resistivity value of the process solution of said processing section; and controlling means for controlling the supply of the first and second process solutions to the processing section from said first and second process solution supply means, respectively, based on the resistivity value detected by said resistivity measuring device and for rapidly discharging the first process solution from said processing section by means of said forcible discharging solution mechanism after the substrates have been washed by the first process solution, said controlling means controlling the second process solution supplying means to introduce said second process solution into said processing section and subsequently controlling introduction of the vapor for drying into said processing section through said drying vapor supply passage while the second process solution is being gradually discharged from said processing section by said process solution discharging means after the substrates have been washed by the second process solution.

2. The apparatus according to claim 1, wherein said forcible discharging solution mechanism includes a plurality of openings, a plurality of covers configured to block said openings, and a cylinder for driving each cover to block or unblock said openings based on an instruction from said controlling means.

3. The apparatus according to claim 1, wherein said forcible discharging solution mechanism includes a detachable cover forming a bottom of the processing section having said supply/discharge port and a cylinder for driving said cover to block or unblock said at least one opening.

4. The apparatus according to claim 1, wherein a plurality of said supply/discharge ports are formed on the lower portion of said processing section.

5. The apparatus according to claim 1, wherein said processing section comprises an inner vessel for reserving process solution and accommodating said boat and substrates, an outer vessel for receiving process solution overflowing from the inner vessel, and a circulation circuit for returning process solution discharged from the outer vessel.

6. The apparatus according to claim 5, wherein said processing section has a detachable upper cover and a gas supply source for supplying non-oxidizing gas to the processing section having an airtight interior when the upper cover is attached to said processing section.

7. The apparatus according to claim 6, wherein said gas supply source communicates with said drying vapor supply passage and said non-oxidizing gas is supplied to the processing section through said drying vapor supply passage.

8. The apparatus according to claim 1, wherein said at least one opening of the forcible discharging solution section has a diameter larger than the diameter of said supply/discharge port.

9. The apparatus according to claim 1, wherein said controlling means controls blocking or unblocking of the at least one opening of said forcible discharging solution mechanism based on the resistivity value detected by said resistivity detecting means.

10. A substrate washing apparatus comprising:

a processing section having a capacity to accommodate a boat holding a plurality of substrates;

a chemical solution supply line for supplying a chemical solution to said processing section for chemically washing the substrates;

a pure water supply line for supplying pure water to said processing section for washing the chemically washed substrates;

an overflow line configured to allow that portion of the chemical solution and the pure water which overflows from said processing section to overflow into said overflow line;

a discharge line for discharging chemical solution and pure water from said process section, said discharge line being provided separately from said overflow line;

a waste solution exhaust line for exhausting chemical solution and pure water from said processing section;

a discharge valve provided in said discharge line;

a resistivity measuring device provided in said discharge line downstream of said valve; and a drain line communicating with said discharge line upstream of said valve.

11. The apparatus according to claim 10, further comprising:

a concentrated waste solution exhaust line communicating with said waste solution exhaust line;

a dilute waste solution exhaust line communicating with said waste solution exhaust line; and switching means for switching said concentrated waste solution exhaust line and said dilute waste solution exhaust line.

12. The apparatus according to claim 10, further comprising:

a concentration sensor provided in said waste solution exhaust line or said processing line and configured to detect the concentration of chemical solution discharged from said processing section.

13. The apparatus according to claim 12, further comprising:

controlling means for sending an instruction to said switching means based on a detection signal from said concentration sensor to switch said concentrated waste solution exhaust line and said dilute waste solution exhaust line.

14. The apparatus according to claim 10, further comprising:

a drain valve provided in said drain line;

a concentration sensor provided in said discharge line and configured to sense a concentration of the solution flowing in the discharge line; and a controller responsive to at least the concentration sensor for opening and closing the discharge valve and the drain valve to permit flow in one of the discharge line or the drain line at any given time.

15. The apparatus according to claim 10, further comprising:

a concentration sensor provided in said discharging line and configured to sense a concentration of the solution flowing in the discharge line; and second switching means for switching flow between said discharge line and said drain line to bypass said resistivity measuring device.

16. The apparatus according to claim 15, wherein said second switching means switches flow between said discharge line and said drain line to bypass said resistivity measuring device based on the concentration of the solution flowing in the discharge line.

17. The apparatus according to claim 16, wherein said second switching means is also time-controlled by a controlling means.

18. A substrate washing apparatus comprising:
- a process vessel having a capacity to accommodate a boat holding a plurality of substrates;
- a process solution supply line for supplying process solution to said process vessel for washing the substrates;
- a circulation line for returning process solution overflowing from said process vessel to said process vessel;
- a replenishing unit for adding said process solution to said process vessel;
- a concentration sensor for measuring concentration of said process solution flowing in said circulation line;
- a liquid level sensor for measuring the amount of said process solution in said process vessel; and
- a controlling section for determining the concentration and the amount of the process solution to be added to said process vessel at time T1 after starting of processing from a relationship between the concentration measured by said concentration sensor at said time T1, the amount of said process solution measured by said liquid level sensor at said time T1, and an initial condition of said process solution, and controlling the adding of the process solution to said process vessel through said replenishing unit in accordance with the determining result.

19. The apparatus according to claims 18, further comprising:
- a bypass line communicating with said circulation line for returning the process solution taken up from said circulation line to said process vessel or said circulation line; and
- a concentration sensor for measuring concentration of the process solution flowing in said bypass line.

20. The apparatus according to claim 18, further comprising:
- temperature controlling means for temperature-controlling said process solution whose concentration is measured by said concentration sensor.

* * * * *